(12) United States Patent
Bruce et al.

(10) Patent No.: US 9,653,395 B2
(45) Date of Patent: May 16, 2017

(54) HYBRID SUBTRACTIVE ETCH/METAL FILL PROCESS FOR FABRICATING INTERCONNECTS

(71) Applicant: International Business Machines Corporation, Armonk, NY (US)

(72) Inventors: Robert L. Bruce, White Plains, NY (US); Gregory M. Fritz, Wakefield, MA (US); Eric A. Joseph, White Plains, NY (US); Hiroyuki Miyazoe, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/157,906

(22) Filed: May 18, 2016

(65) Prior Publication Data

US 2017/0040258 A1 Feb. 9, 2017

(51) Int. Cl.
*H01L 21/3213* (2006.01)
*H01L 23/522* (2006.01)
*H01L 23/528* (2006.01)
*H01L 23/532* (2006.01)
*H01L 21/768* (2006.01)

(52) U.S. Cl.
CPC ...... *H01L 23/5226* (2013.01); *H01L 21/7685* (2013.01); *H01L 21/76841* (2013.01); *H01L 21/76879* (2013.01); *H01L 21/76883* (2013.01); *H01L 23/528* (2013.01); *H01L 23/53228* (2013.01); *H01L 23/53242* (2013.01)

(58) Field of Classification Search
CPC .......... H01L 21/3213; H01L 21/76802; H01L 21/76879; H01L 21/76841; H01L 23/522
See application file for complete search history.

(56) References Cited

U.S. PATENT DOCUMENTS

| 5,240,559 | A | 8/1993 | Ishida |
| 6,277,745 | B1 | 8/2001 | Liu et al. |
| 6,445,072 | B1 | 9/2002 | Subramanian |
| 6,667,559 | B2 | 12/2003 | Tsukada et al. |
| 7,400,025 | B2 * | 7/2008 | Pitts ............... H01F 17/0013 257/531 |
| 7,553,427 | B2 | 6/2009 | Ludviksson et al. |
| 8,053,893 | B2 * | 11/2011 | Noguchi ............ H01L 21/314 257/758 |
| 8,617,982 | B2 | 12/2013 | Danek et al. |
| 8,679,359 | B2 | 3/2014 | Wu et al. |
| 8,871,107 | B2 | 10/2014 | Fuller et al. |
| 8,912,041 | B2 | 12/2014 | Peng et al. |
| 2005/0121792 | A1 * | 6/2005 | Harada ............ H01L 21/76802 257/758 |
| 2005/0230834 | A1 | 10/2005 | Schmitt |

(Continued)

FOREIGN PATENT DOCUMENTS

JP 11-307515 A 5/1999
WO 2014159144 A 10/2014

*Primary Examiner* — Phuc Dang
(74) *Attorney, Agent, or Firm* — Louis Percello

(57) ABSTRACT

In one example, a method for fabricating an integrated circuit includes patterning a layer of a first conductive metal, via a subtractive etch process, to form a plurality of lines for connecting semiconductor devices on the integrated circuit. A large feature area is formed outside of the plurality of conductive lines via a metal fill process using a second conductive metal.

20 Claims, 31 Drawing Sheets

(56) References Cited

U.S. PATENT DOCUMENTS

| | | | |
|---|---|---|---|
| 2007/0111497 A1* | 5/2007 | Agarwala | H01L 21/76802 438/598 |
| 2009/0079080 A1 | 3/2009 | Stecher | |
| 2009/0239369 A1 | 9/2009 | Kim | |
| 2010/0283155 A1 | 11/2010 | Tang | |
| 2014/0021612 A1 | 1/2014 | Huang et al. | |
| 2014/0127906 A1 | 5/2014 | Cabral, Jr. et al. | |
| 2014/0252629 A1 | 9/2014 | Chang et al. | |
| 2014/0252630 A1 | 9/2014 | Chang et al. | |
| 2015/0179831 A1* | 6/2015 | Suen | H01L 31/02327 257/622 |
| 2015/0348903 A1 | 12/2015 | Melzner | |
| 2015/0364413 A1 | 12/2015 | Peng | |
| 2015/0380272 A1 | 12/2015 | Wu | |
| 2016/0093566 A1* | 3/2016 | Ting | H01L 23/5226 257/774 |

* cited by examiner

HYBRID SUBTRACTIVE ETCH/METAL FILL PROCESS FOR FABRICATING INTERCONNECTS

FIELD OF THE DISCLOSURE

The present disclosure relates generally to the fabrication of integrated circuits and relates more specifically the fabrication of interconnects for connecting individual devices on an integrated circuit.

BACKGROUND OF THE DISCLOSURE

As the feature sizes in complementary metal-oxide-semiconductor (CMOS) technology continue to shrink, it becomes increasingly difficult to fabricate the metal interconnects using conventional processing techniques. For example, using a damascene process to fill trenches with copper often results in undesirable effects including poor liner/seed coverage on the trench walls, pinch off at the trench mouth, and reentrant reactive ion etch (RIE) profiles. In addition, the increasing ratio of the liner to copper, copper grain growth, and copper grain scattering phenomena result in increased copper resistivity, which makes the copper less effective as an interconnect material.

SUMMARY OF THE DISCLOSURE

In one example, a method for fabricating an integrated circuit includes patterning a layer of a first conductive metal, via a subtractive etch process, to form a plurality of lines for connecting semiconductor devices on the integrated circuit. A large feature area is formed outside of the plurality of conductive lines via a metal fill process using a second conductive metal.

In another example, an integrated circuit includes a wafer, a layer of dielectric material deposited on the wafer, a plurality of conductive lines formed on the layer of dielectric material, and a plurality of vias coupled to the plurality of conductive lines and extending through the layer of dielectric material. Interfaces between the plurality of conductive lines and the plurality of vias are formed as continuous lines of metal.

BRIEF DESCRIPTION OF THE DRAWINGS

The teachings of the present disclosure can be readily understood by considering the following detailed description in conjunction with the accompanying drawings, in which.

To facilitate understanding, identical reference numerals have been used, where possible, to designate identical elements that are common to the Figures.

DETAILED DESCRIPTION

In one example, a hybrid subtractive etch/metal fill process for fabricating interconnects is disclosed. As discussed above, conventional techniques for fabricating copper interconnects tend to introduce undesirable effects when working with the small feature sizes demanded by current complementary metal-oxide-semiconductor (CMOS) technology.

Examples of the present disclosure provide a hybrid subtractive etch/metal fill process for fabricating interconnects. In one example, a subtractive etch process is used to pattern the high-density line-space area of the integrated circuit (IC), while a metal fill process such as electroplating or vapor deposition is used to fill large feature areas of the IC, such as areas configured to house electrical pads. This approach allows fine metal interconnects (e.g., smaller than approximately forty nanometers) with large grains to be fabricated. At the same time, it minimizes adverse effects on the large features areas, which have different etch rates than the high-density line-space areas (due to micro-loading effects).

FIGS. 1A-1G, FIGS. 2A-2G, and FIGS. 3A-3G illustrate an integrated circuit (IC) 100 during various stages of a first fabrication process performed according to examples of the present disclosure. As such, when viewed in sequence, FIGS. 1A-1G, FIGS. 2A-2G, and FIGS. 3A-3G also serve as a flow diagram for the first fabrication process. In particular, FIGS. 1A-1G illustrate top views of the IC 100 during various stages of the first fabrication process, while FIGS. 2A-2G illustrate first corresponding cross sectional views (i.e., taken along sectional line A-A' of FIG. 1A) of the IC 100 of FIGS. 1A-1G during the various stages of the first fabrication process, and FIGS. 3A-3G illustrate second corresponding cross sectional views (i.e., taken along sectional line B-B' of FIG. 1A) of the IC 100 of FIGS. 1A-1G during the various stages of the first fabrication process.

Figure 1A:
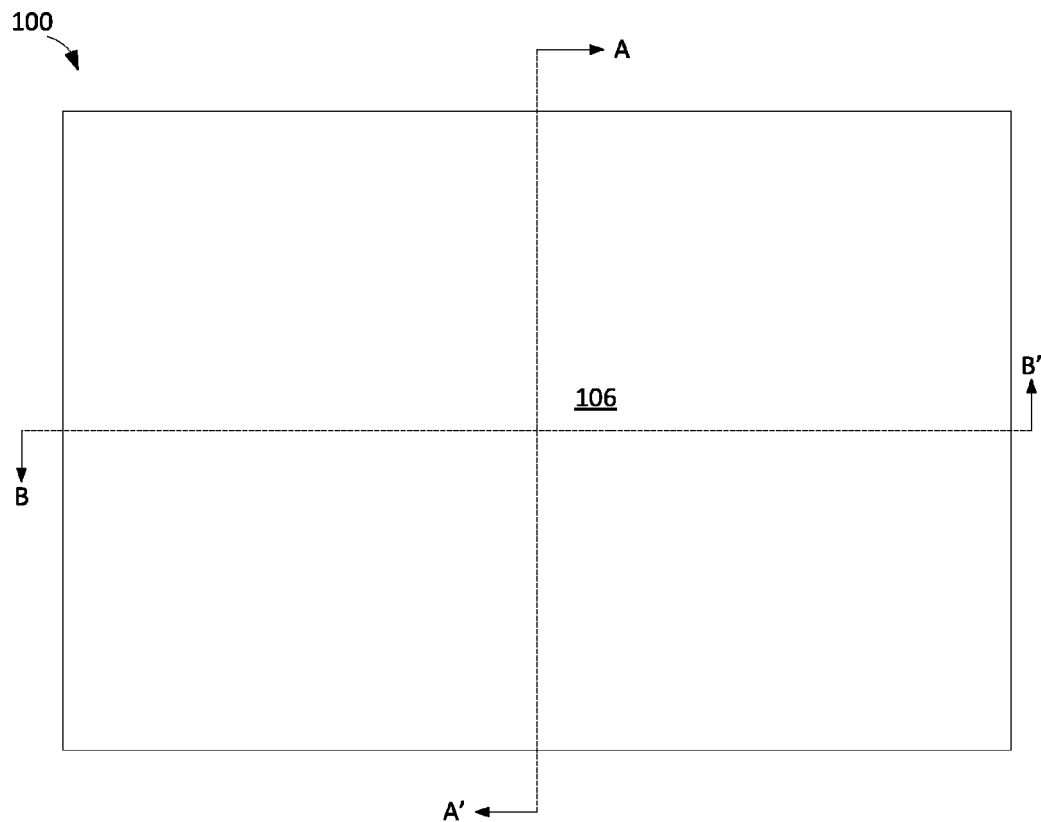
FIGS. 1A-1G illustrate top views of an integrated circuit during various stages of a first fabrication process according to examples of the present disclosure.
Figure 2A:
FIGS. 2A-2G illustrate corresponding cross sectional views of the integrated circuit of FIGS. 1A-1G taken along line A-A' of FIG. 2A during the various stages of the first fabrication process.

FIGS. 1A-1G, FIGS. 2A-2G, and FIGS. 3A-3G in particular illustrate a one-level integration process. Referring simultaneously to FIG. 1A, FIG. 2A, and FIG. 3A the IC 100 begins as a silicon (Si) wafer 102. A first liner layer 104 is deposited on the wafer 102. In one example, the first liner layer 104 comprises tantalum (Ta), tantalum nitride (TaN), cobalt (Co), titanium (Ti), titanium nitride (TiN), tungsten (W), ruthenium (Ru), manganese (Mn), manganese oxides (MnOx), or manganese silicates (MnSixOy). A first conductive metal layer 106 is also deposited on the first liner layer 104, for example via an electroplating process or a vapor deposition process. In one example, the first conductive metal layer 106 comprises copper (Cu). However, the first conductive metal layer 106 could comprise any metal or metal alloy (including, but not limited to, gold or silver).

Figure 1B:
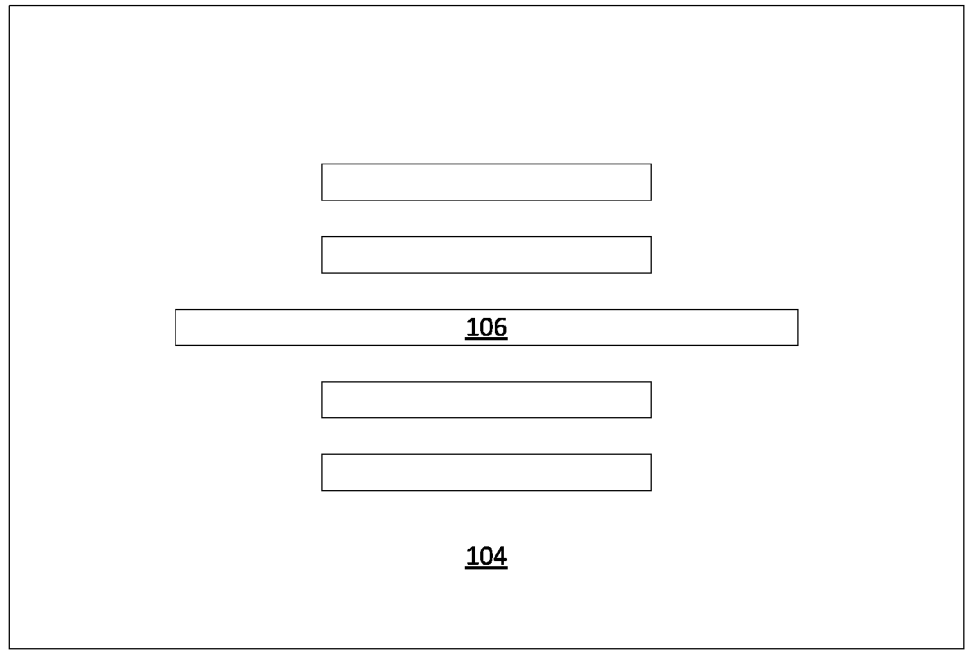
Figure 2B:
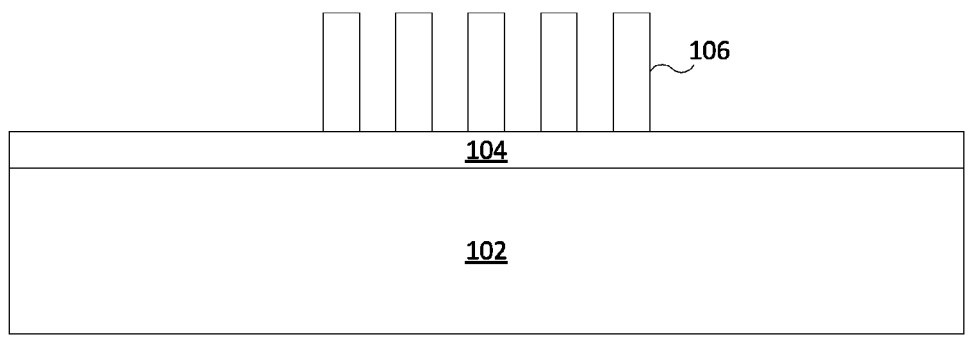
Figure 3A:
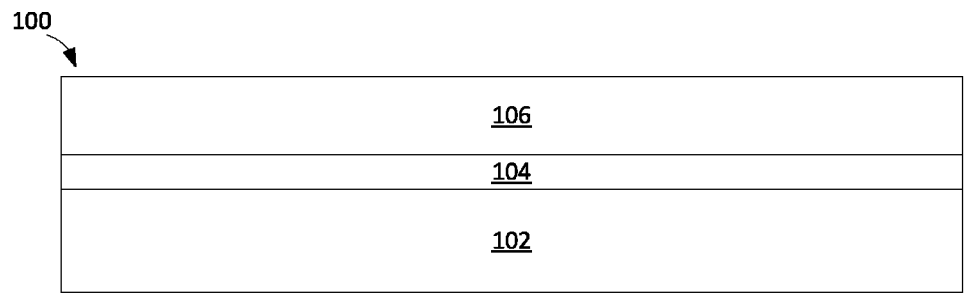
FIGS. 3A-3G illustrate corresponding cross sectional views of the integrated circuit of FIGS. 1A-1G taken along line B-B' of FIG. 2A during the various stages of the first fabrication process.
Figure 3B:
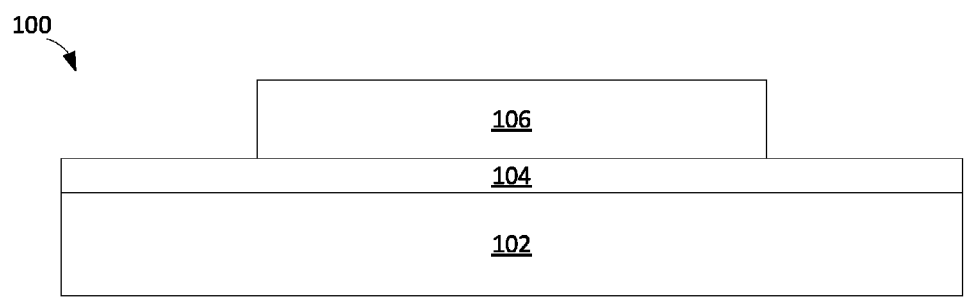

As illustrated in FIG. 1B, FIG. 2B, and FIG. 3B, a subtractive etch process is next used to pattern the first conductive metal layer 106. That is, a portion of the first conductive metal layer 106 is removed down to the first liner layer 104. The patterning of the first conductive metal layer 106 results in a series of thin conductive lines (e.g., interconnects) being formed. Between each pair of conductive lines is a space.

Figure 1C:
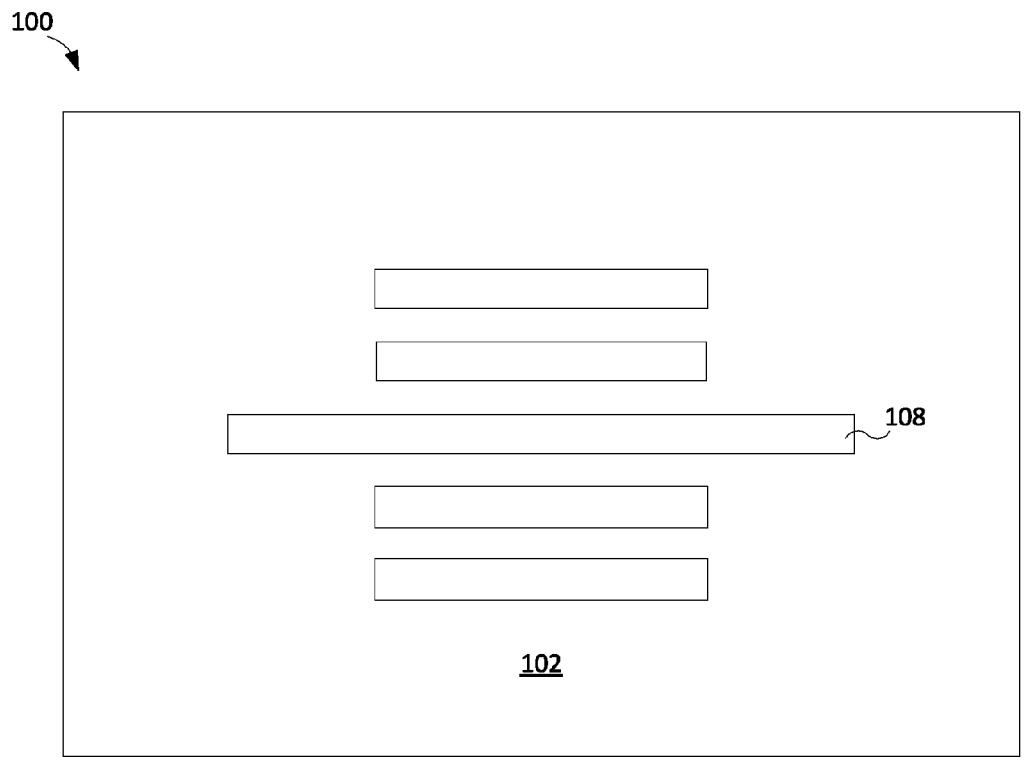
Figure 2C:
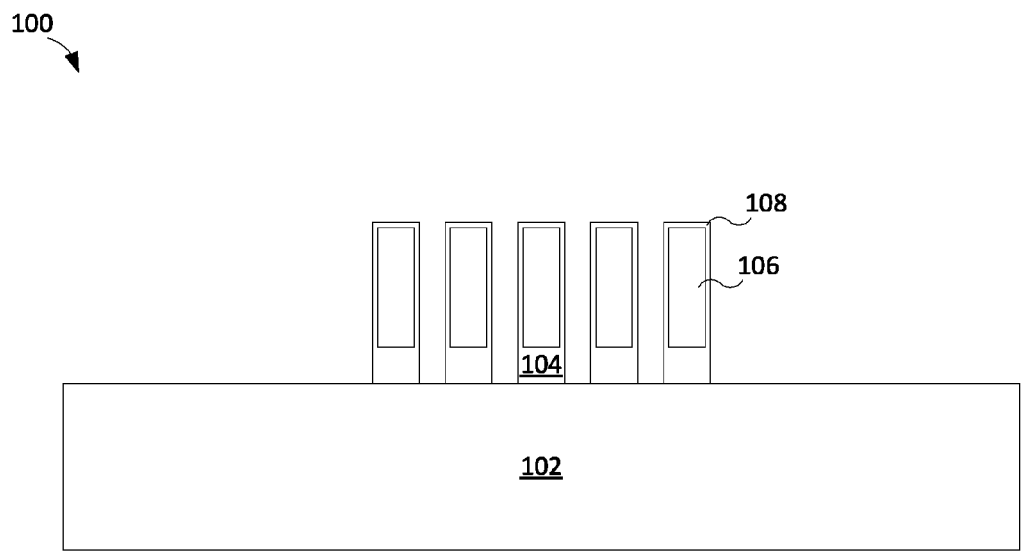
Figure 3C:
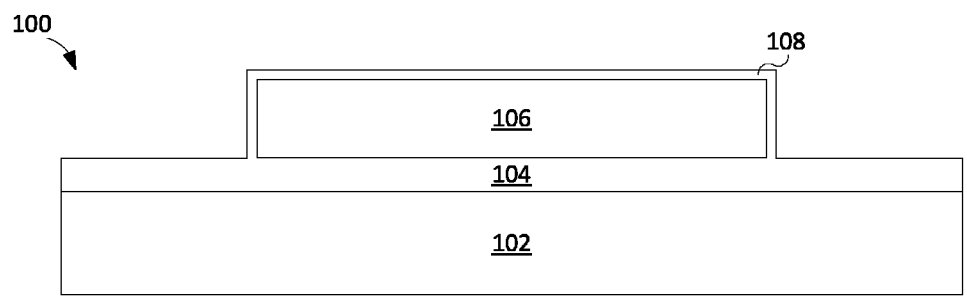

As illustrated in FIG. 1C, FIG. 2C, and FIG. 3C, a second liner layer 108 is next deposited on the first conductive metal layer 106 and first liner layer 104. In one example, the second liner layer 108 is formed from the same material as the first liner layer 104 (e.g., Ta, TaN, Co, Ti, TiN, W, Ru, Mn, MnOx, or MnSixOy). A subsequent etch process removes any portions of the first liner layer 104 and the second liner layer 108 that do not directly contact the thin conductive lines.

Figure 1D:
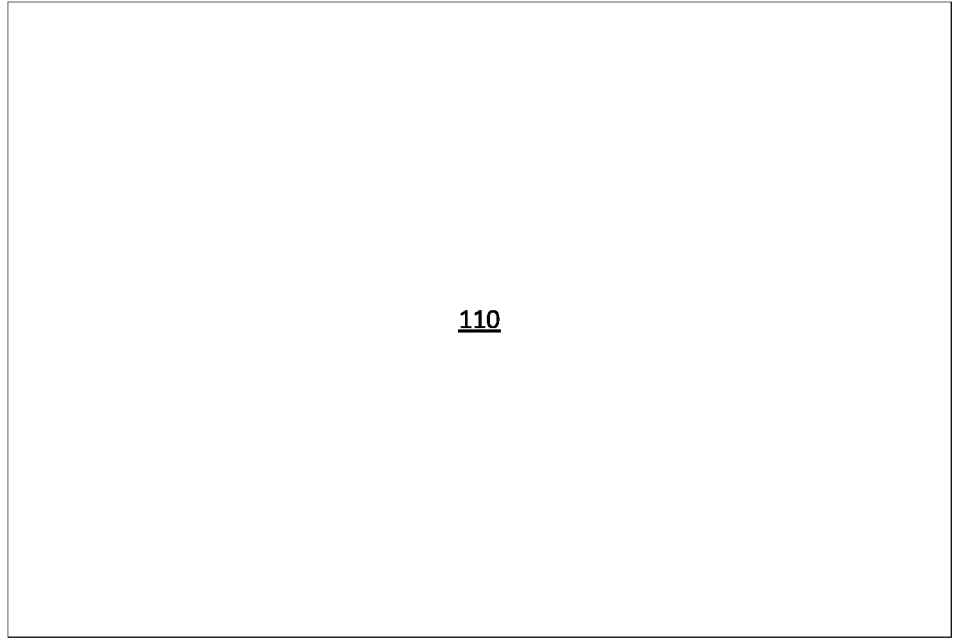
Figure 2D:
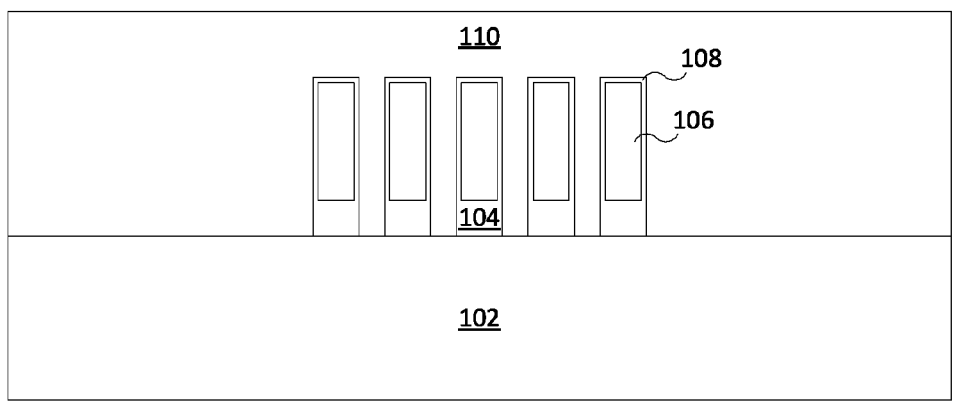
Figure 3D:
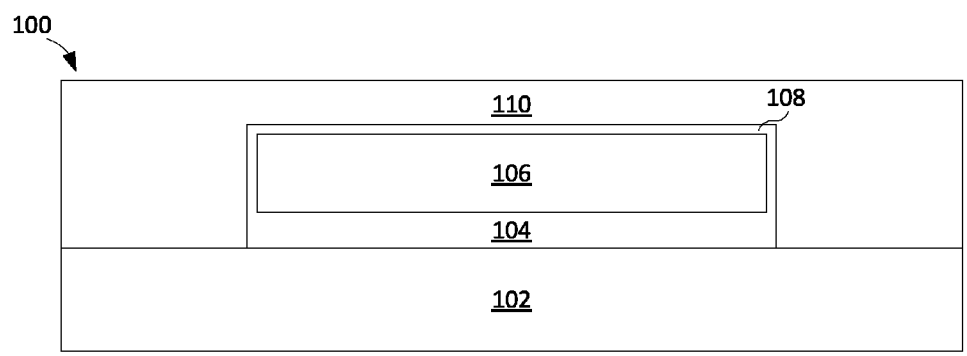

As illustrated in FIG. 1D, FIG. 2D, and FIG. 3D, an interlayer dielectric (ILD) layer 110 is next deposited over the second liner layer 108 and the wafer 102. The ILD layer 110 also fills in the trenches between the (lined) conductive lines of the first conductive metal layer 106. In one example, the ILD layer 110 comprises a low-k dielectric material. The ILD layer 110 may be formed, for example, from silicon dioxide ($SiO_2$), a low-temperature oxide (LTO), a high-temperature oxide (HTO), or a flowable oxide (FOX). The ILD layer 110 may be planarized, for example using chemical mechanical polishing.

Figure 1E:
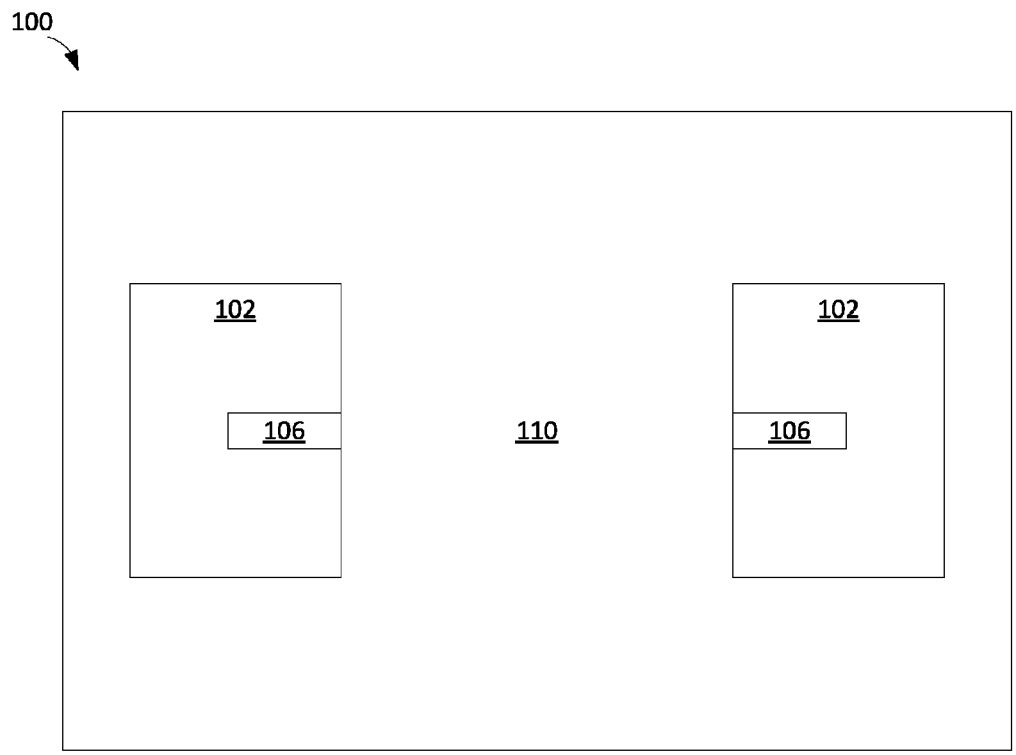
Figure 2E:
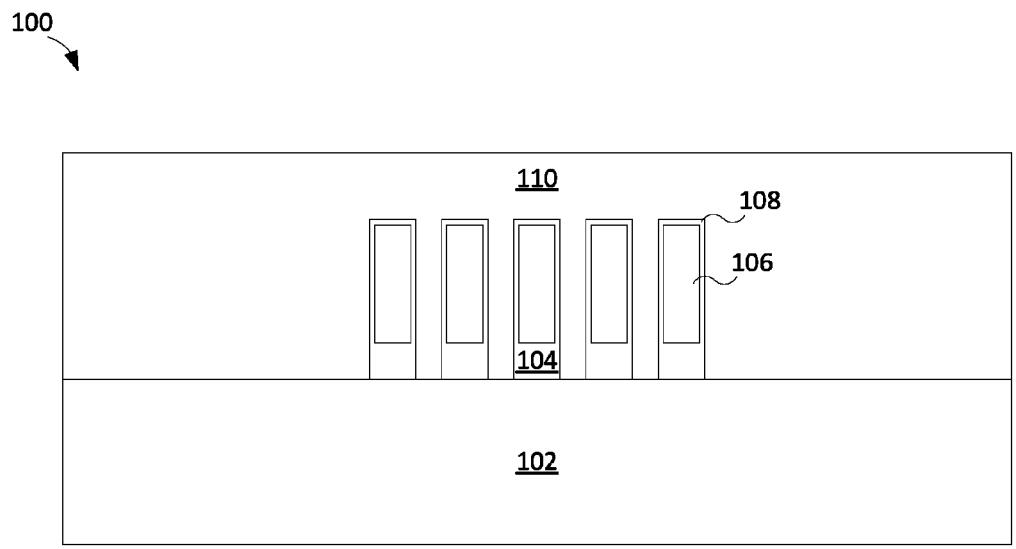
Figure 3E:
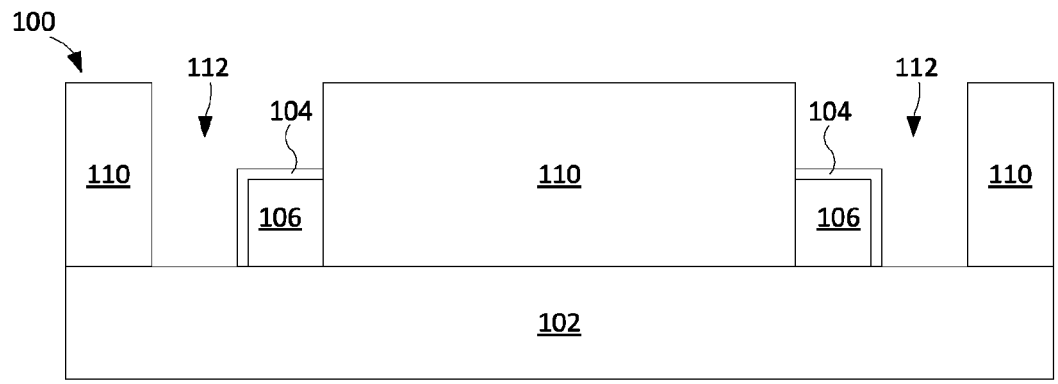

As illustrated in FIG. 1E, FIG. 2E, and FIG. 3E, the ILD layer 110 is next patterned to create large feature areas 112. That is, a portion of the ILD layer 110 is removed down to the wafer 102 to create recesses or trenches for large features such as electrical pads. In one example, the large feature areas 112 may overlap slightly with the high-density line-space areas (e.g., as evidenced by the fact that some of the conductive lines of the first conductive metal layer 106 extend into the large feature areas 112.

Figure 1F:
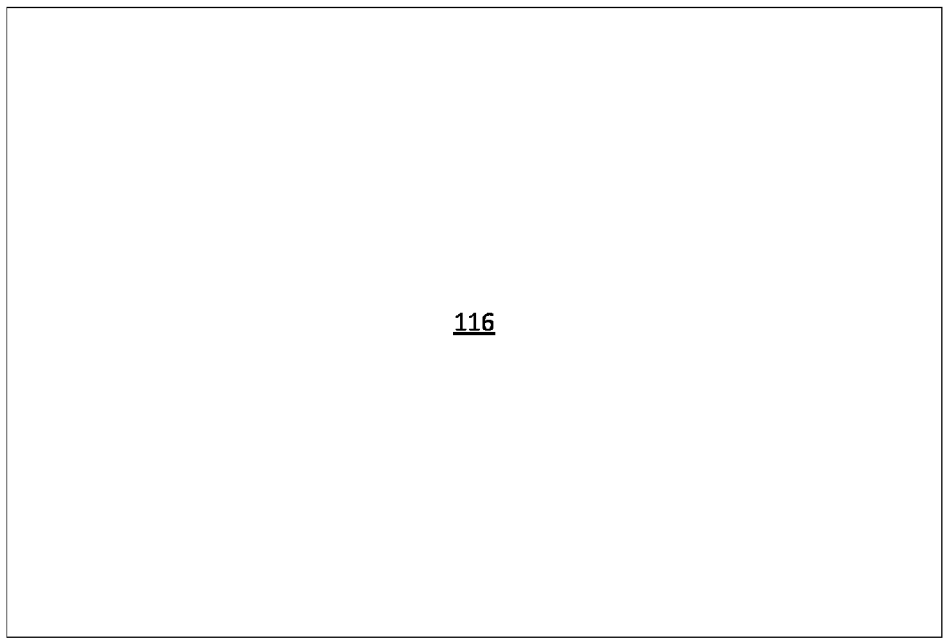
Figure 2F:
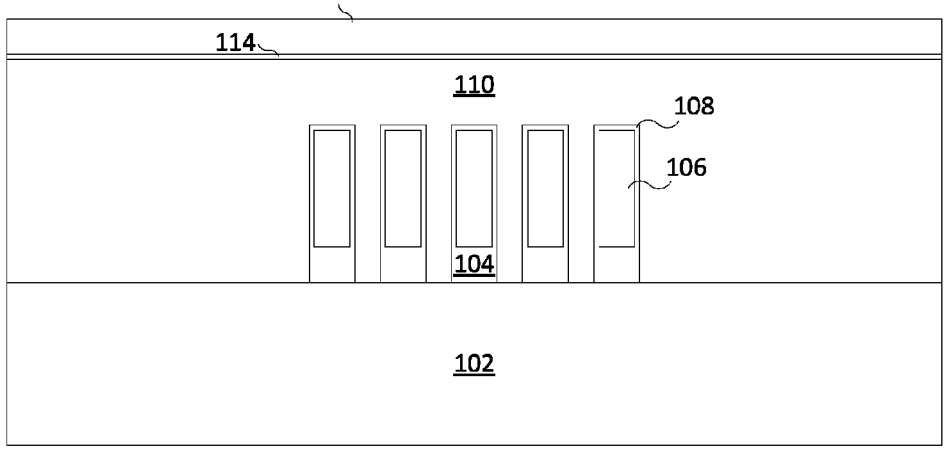
Figure 3F:
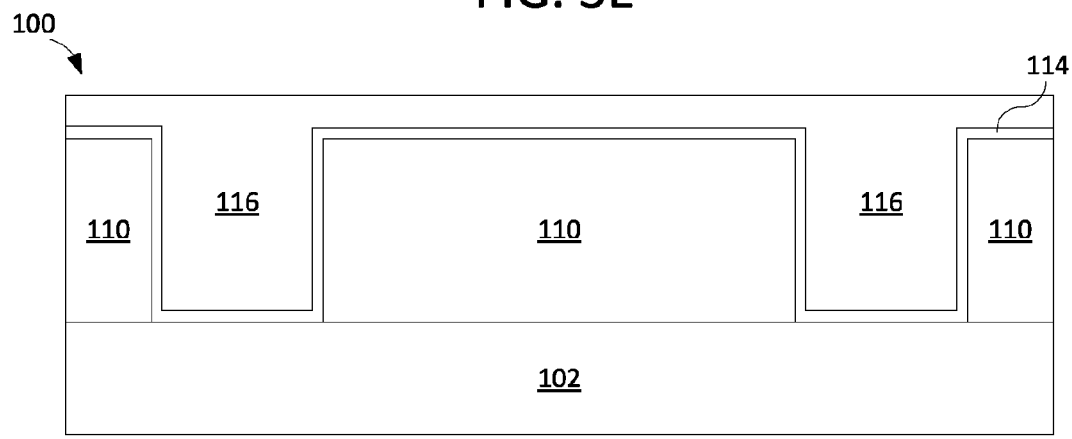

As illustrated in FIG. 1F, FIG. 2F, and FIG. 3F, a third liner layer 114 is next deposited over the wafer 102 and ILD layer 110. A second conductive metal layer 116 is then deposited over the third liner layer 114, for example via an electroplating process or a vapor deposition process. As illustrated, the second conductive metal layer 116 fills in the large feature areas 112 created in FIGS. 1E and 2E. In one example, the third liner layer 114 is formed from the same material as the first liner layer 104 and the second liner layer 108. In a further example, the second conductive metal layer 116 is formed from the same conductive material (e.g., copper, or other conductive metal or metal alloy) and the first conductive metal layer 106.

Figure 1G:
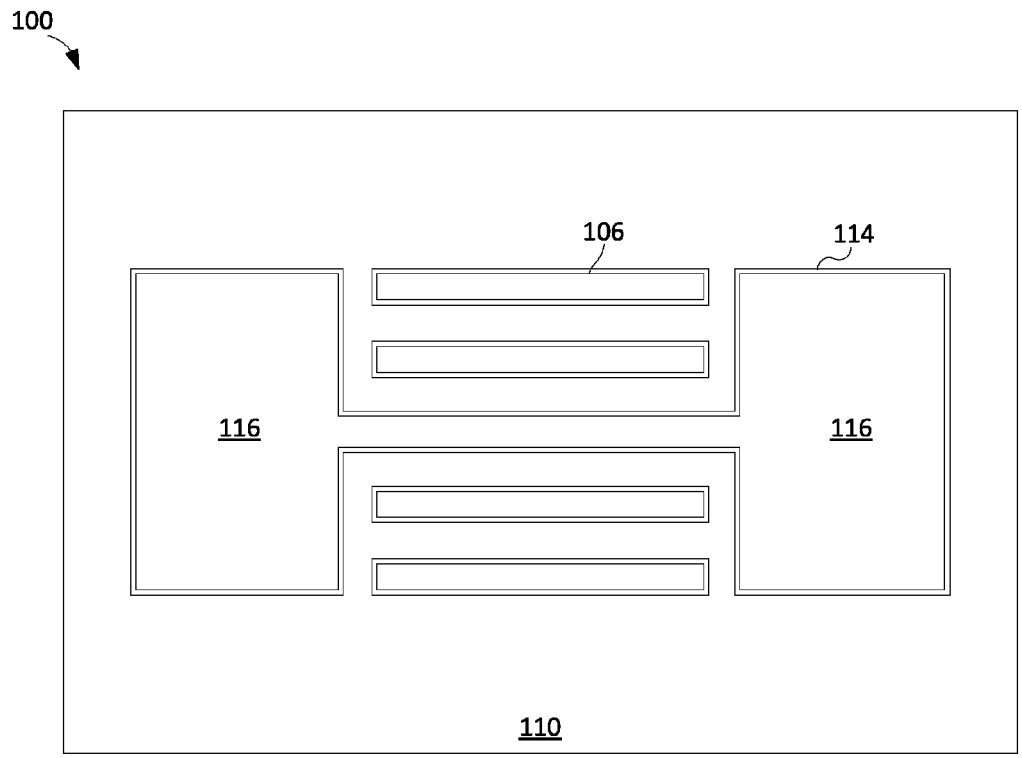
Figure 2G:
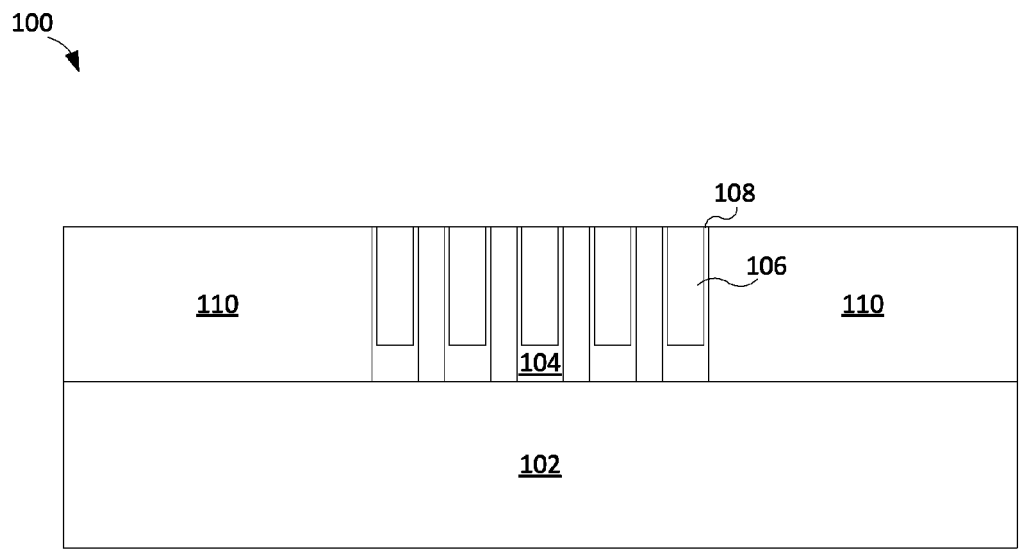
Figure 3G:
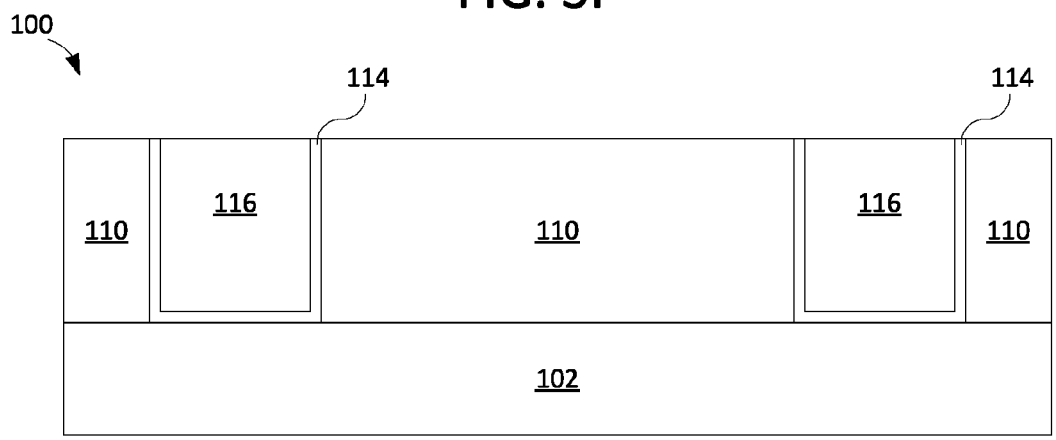

As illustrated in FIG. 1G, FIG. 2G, and FIG. 3G the second conductive metal layer 116 is next polished down to the ILD layer 110. Thus, this polishing step removes some of the second conductive metal layer 116 and the third liner layer 114.

The resultant IC 100 includes a single level of a high-density line-space area comprised of the conductive lines formed by the first conductive metal layer 106 and a single level of one or more large feature areas comprised of the regions (e.g., electrical pads) formed by the second conductive metal layer 116. The high-density line-space area is formed via the subtractive etch process illustrated in FIGS. 1B, 2B, and 3B, while the large feature areas are formed via the metal fill process illustrated in FIGS. 1F, 2F, and 3F. Thus, the large feature areas are largely unaffected by the subtractive etch process that is used to form the interconnects. Moreover, the disclosed process makes it possible to form the interconnects using any metal or metal alloy, including those that are not feasible to use in conventional damascene processes (e.g., processes that require a small trench to be filled with the metal).

FIGS. 4A-4H, FIGS. 5A-5H, and FIGS. 6A-6H illustrate an integrated circuit (IC) 200 during various stages of a second fabrication process performed according to examples of the present disclosure. As such, when viewed in sequence, FIGS. 4A-4H, and FIGS. 5A-5H, and FIGS. 6A-6H also serve as a flow diagram for the second fabrication process. In particular, FIGS. 4A-4H illustrate top views of the IC 200 during various stages of the second fabrication process, while FIGS. 5A-5H illustrate first corresponding cross sectional views (i.e., taken along sectional line A-A' of FIG. 4A) of the IC 200 of FIGS. 4A-4H during the various stages of the second fabrication process, and FIGS. 6A-6H illustrate second corresponding cross sectional views (i.e., taken along sectional line B-B' of FIG. 4A) of the IC 200 of FIGS. 4A-4H during the various stages of the second fabrication process.

Figure 4A:
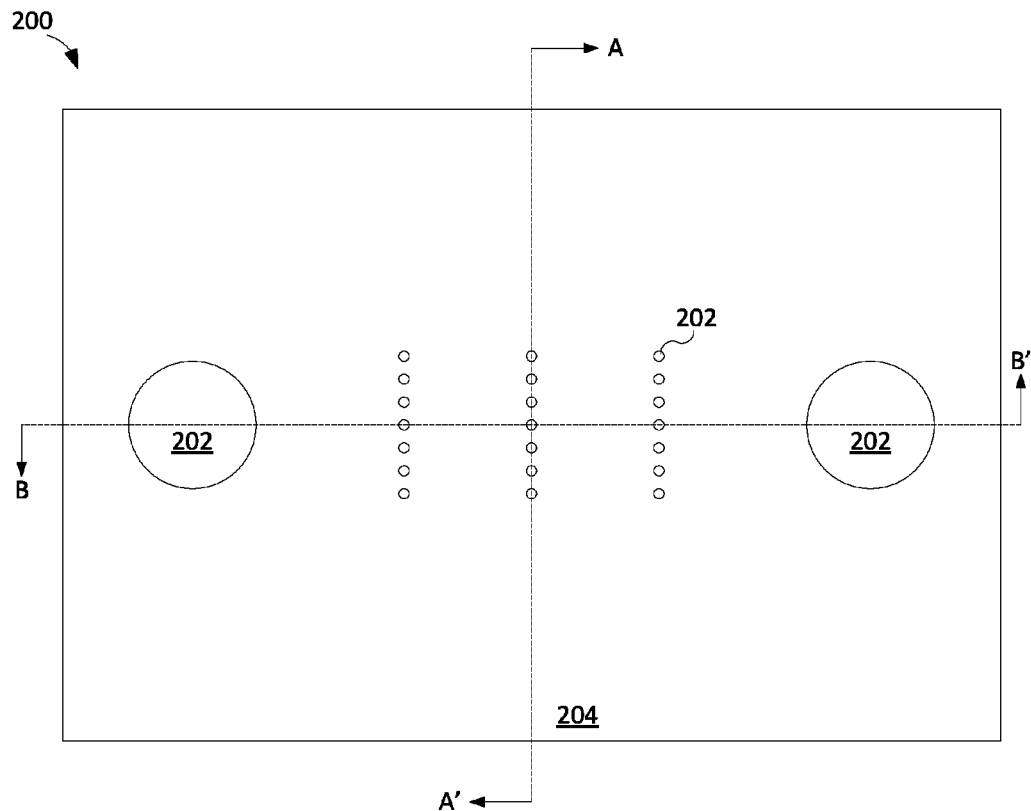
FIGS. 4A-4H illustrate top views of an integrated circuit during various stages of a second fabrication process.
Figure 5A:
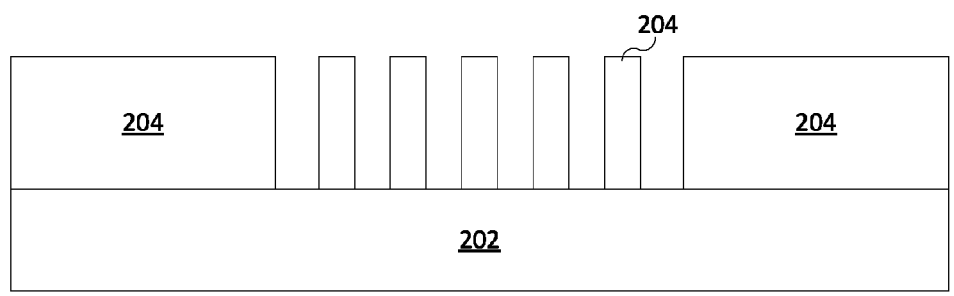
FIGS. 5A-5H illustrate corresponding cross sectional views of the integrated circuit of FIGS. 4A-4H taken along line A-A' of FIG. 4A during the various stages of the second fabrication process.

FIGS. 4A-4H, FIGS. 5A-5H, and FIGS. 6A-6H in particular illustrate a two-level integration process. Referring simultaneously to FIG. 4A, FIG. 5A, and FIG. 6A, the IC 200 begins as a silicon (Si) wafer 202. A first dielectric layer 204 is deposited on the wafer and patterned (e.g., etched down to the wafer 202) to create a plurality of vias.

Figure 4B:
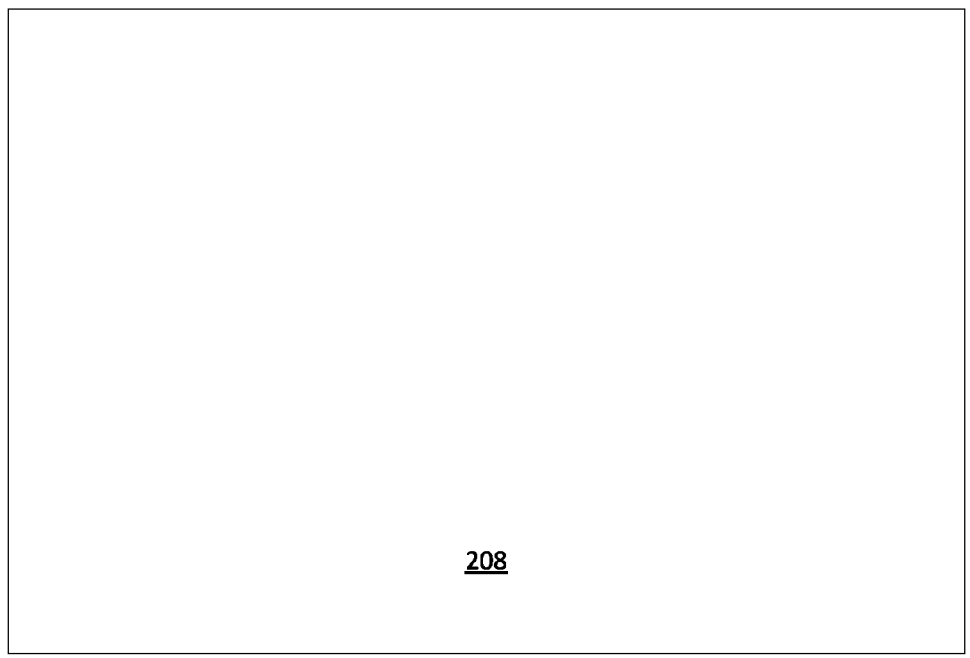
Figure 5B:
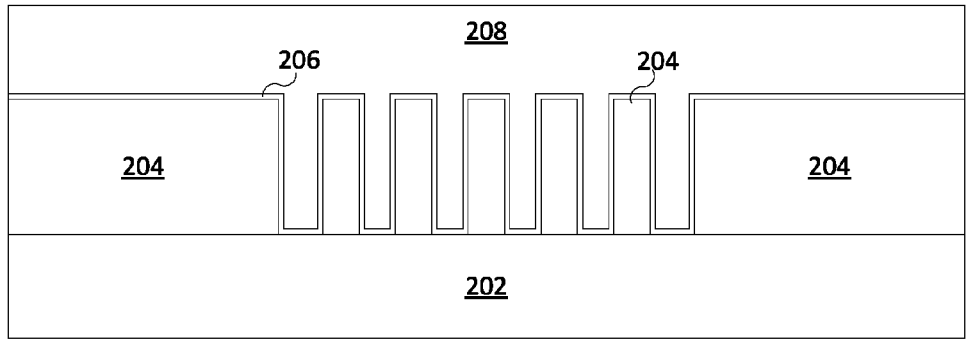
Figure 6A:
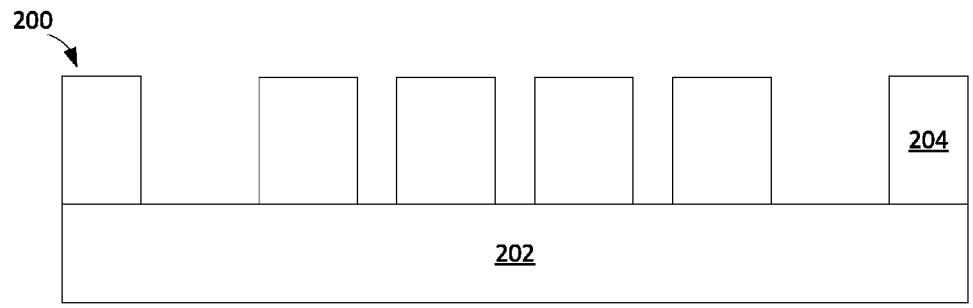
FIGS. 6A-6H illustrate corresponding cross sectional views of the integrated circuit of FIGS. 4A-4H taken along line B-B' of FIG. 4A during the various stages of the second fabrication process.
Figure 6B:
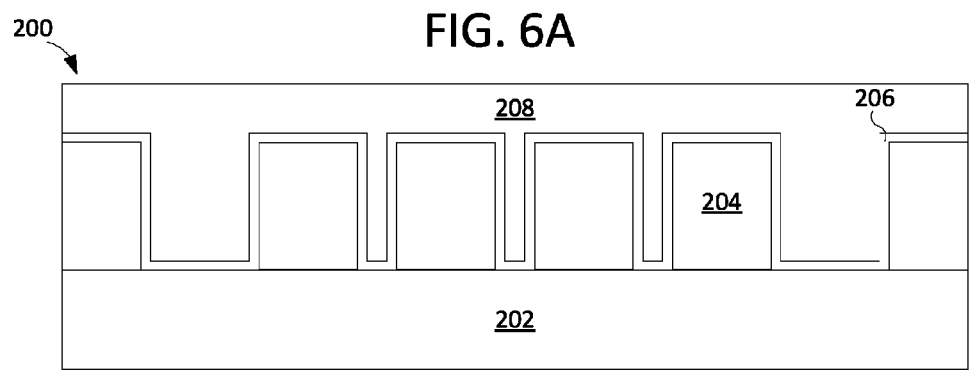

As illustrated in FIGS. 4B, 5B, and 6B, a first liner layer 206 is next deposited over the first dielectric layer 204. The first liner layer 206 lines the vias. The first liner layer 206 may comprise, for example, Ta, TaN, Co, Ti, TiN, W, Ru, Mn, MnOx, or MnSixOy. A first conductive metal layer 208 is next deposited, for example, via electroplating or vapor deposition, over the first liner layer 206. The first conductive metal layer 208 fills the vias. The first conductive metal layer 208 may comprise copper. However, the first conductive metal layer 208 could comprise any metal or metal alloy (including, but not limited to, gold or silver).

Figure 4C:
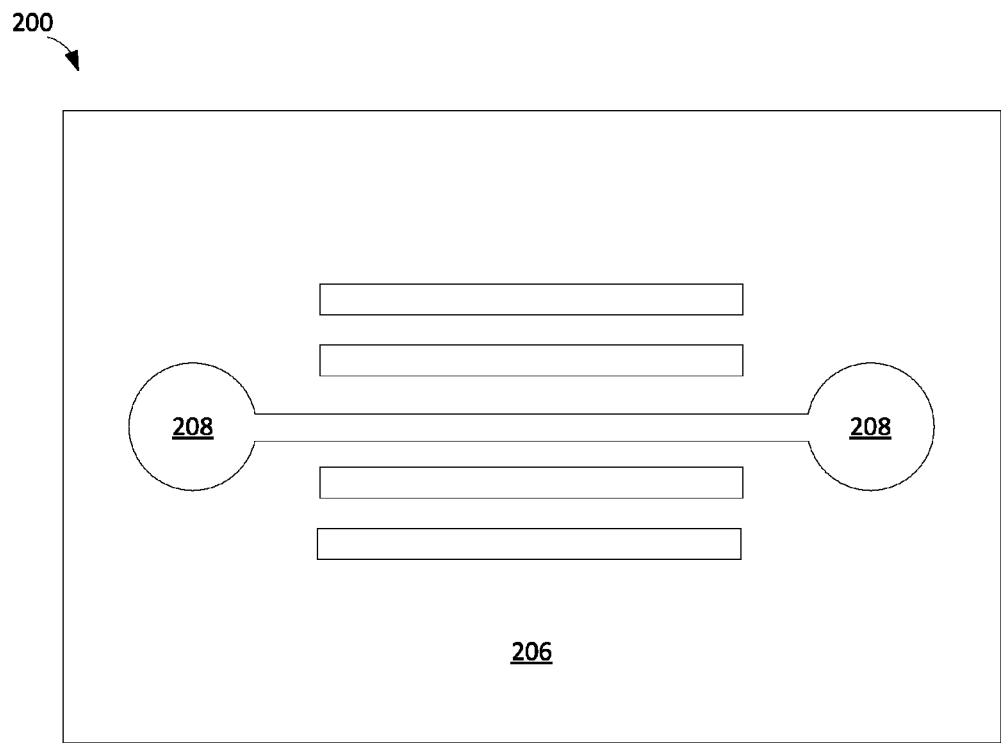
Figure 5C:
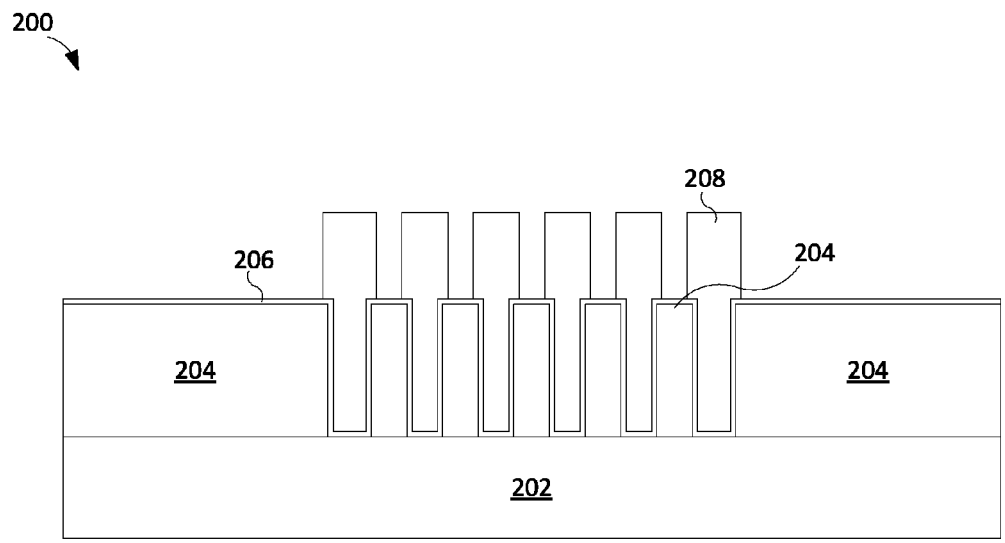
Figure 6C:
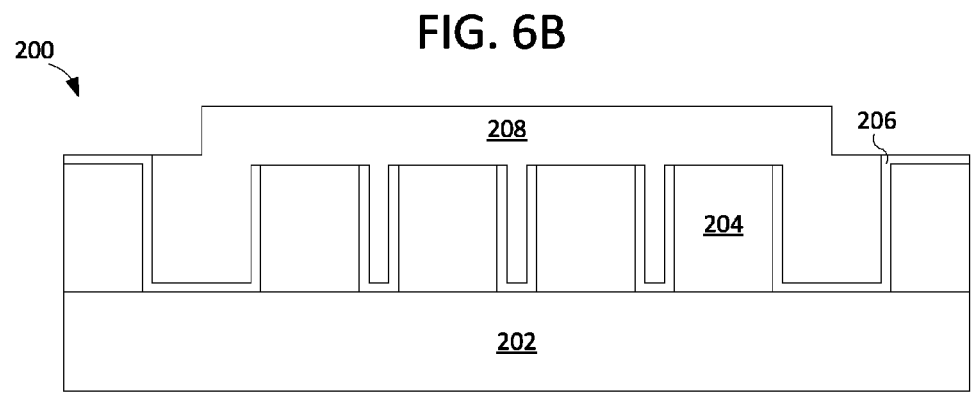

As illustrated in FIGS. 4C, 5C, and 6C, a subtractive etch process is used to etch the first conductive metal layer 208 down to the first liner layer 206, in all areas except for those above the vias; these areas become a high-density line-space area. The portion of the first conductive metal layer 208 that resides above the vias remains and extends above the first liner layer 206, forming a plurality of conductive lines (e.g., interconnects). Between each pair of conductive lines is a trench.

Figure 4D:
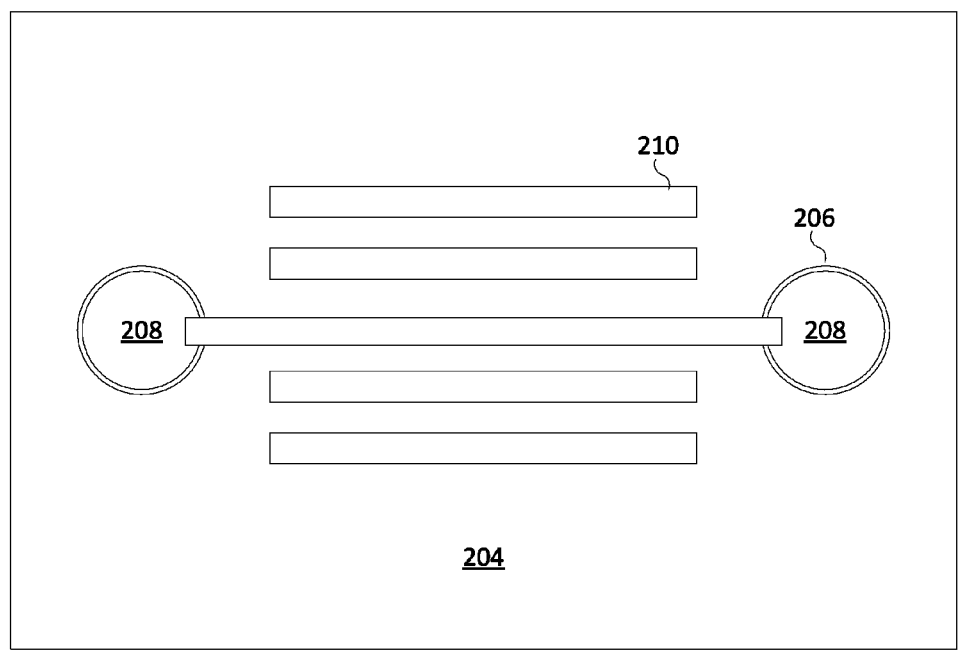
Figure 5D:
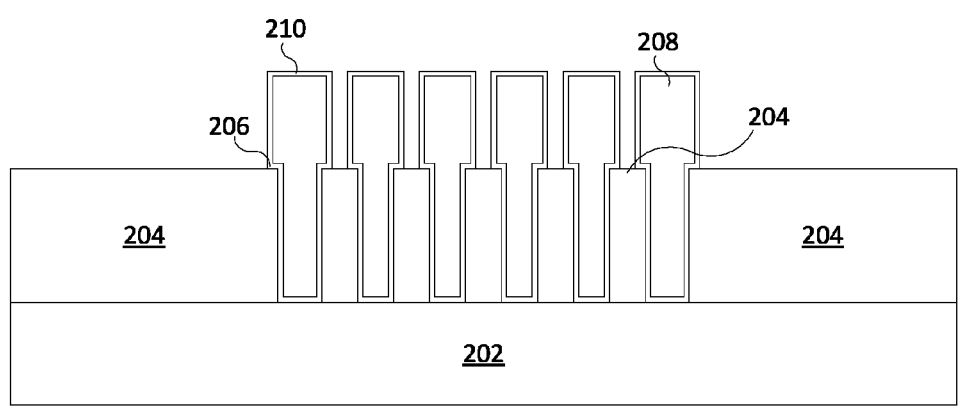
Figure 6D:
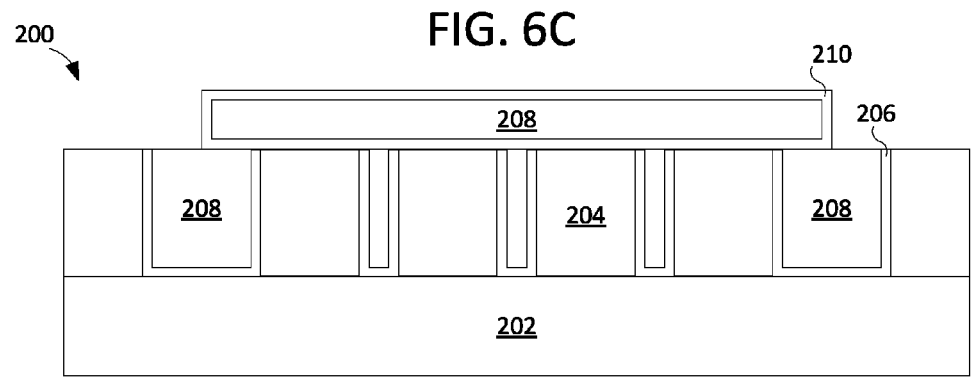

As illustrated in FIGS. 4D, 5D, and 6D, a second liner layer 210 is deposited over the first conductive metal layer 208 and the first liner layer 206. The second liner layer 210 may comprise the same material as the first liner layer 206. The second liner layer 210 and the first liner layer 206 are then etched down to the first dielectric layer 204, so that the only remaining portions of the second liner layer 210 are the portions that line the conductive lines, and the only remaining portions of the first liner layer 206 are the portions that line the vias.

Figure 4E:
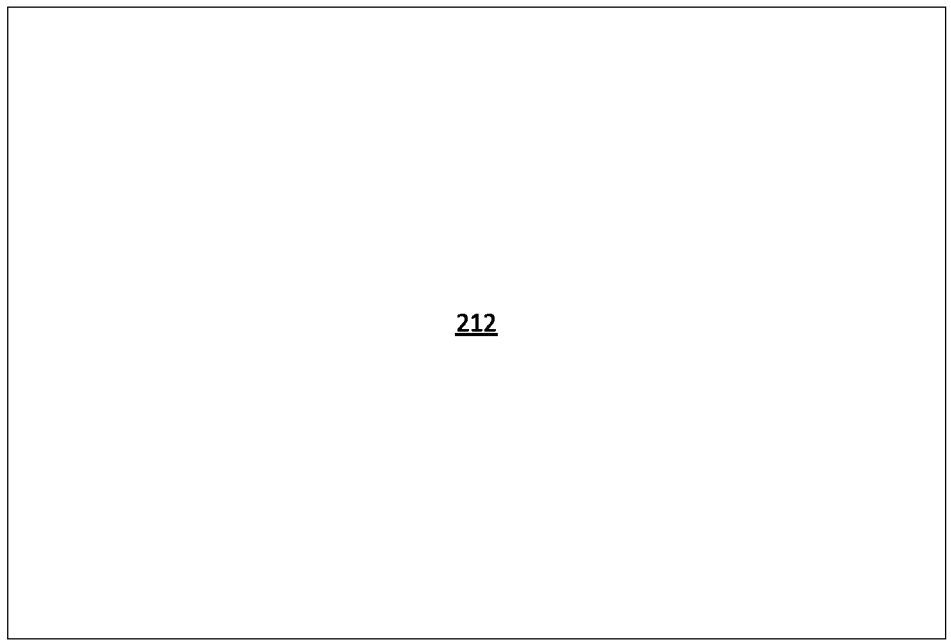
Figure 5E:
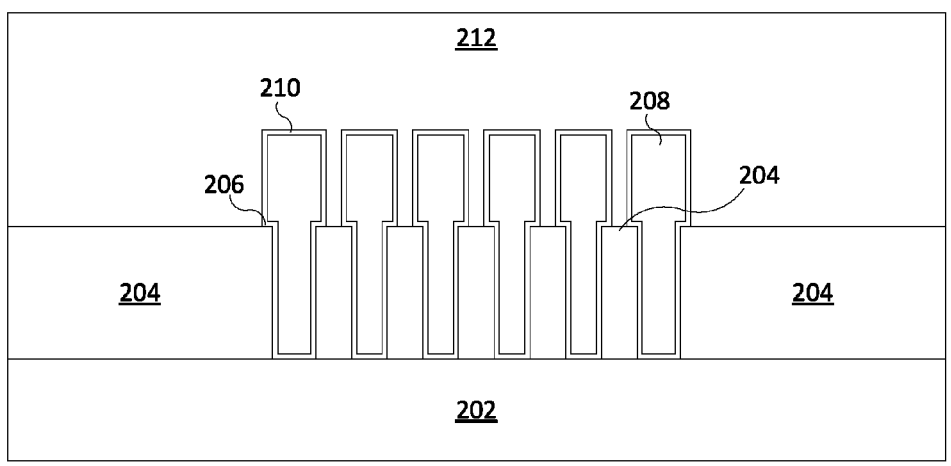
Figure 6E:
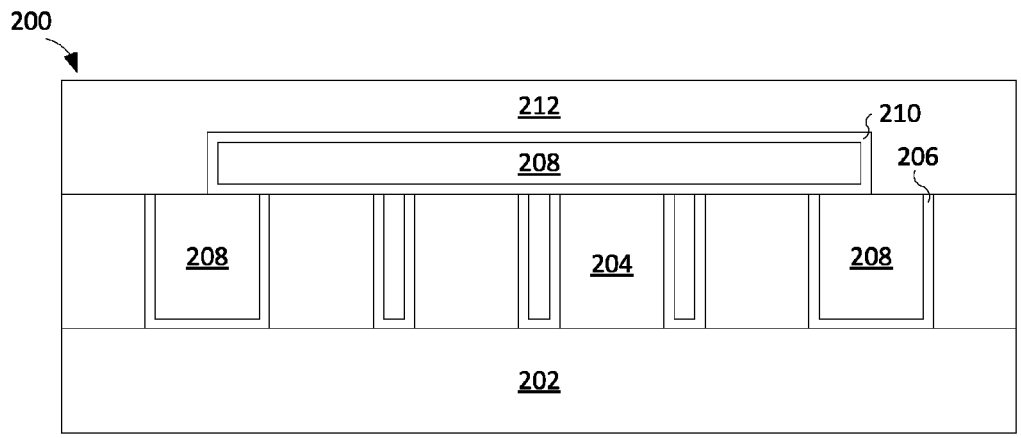

As illustrated in FIGS. 4E, 5E, and 6E, an interlayer dielectric (ILD) layer 212 is next deposited over the second liner layer 210 and the first dielectric layer 204. The ILD layer 212 also fills in the trenches between the (lined) conductive lines of the first conductive metal layer 208. In one example, the ILD layer 212 comprises a low-k dielectric material. The ILD layer 212 may be formed, for example, from silicon dioxide ($SiO_2$), a low-temperature oxide (LTO), a high-temperature oxide (HTO), or a flowable oxide (FOX). The ILD layer 212 may be planarized, for example using chemical mechanical polishing.

Figure 4F:
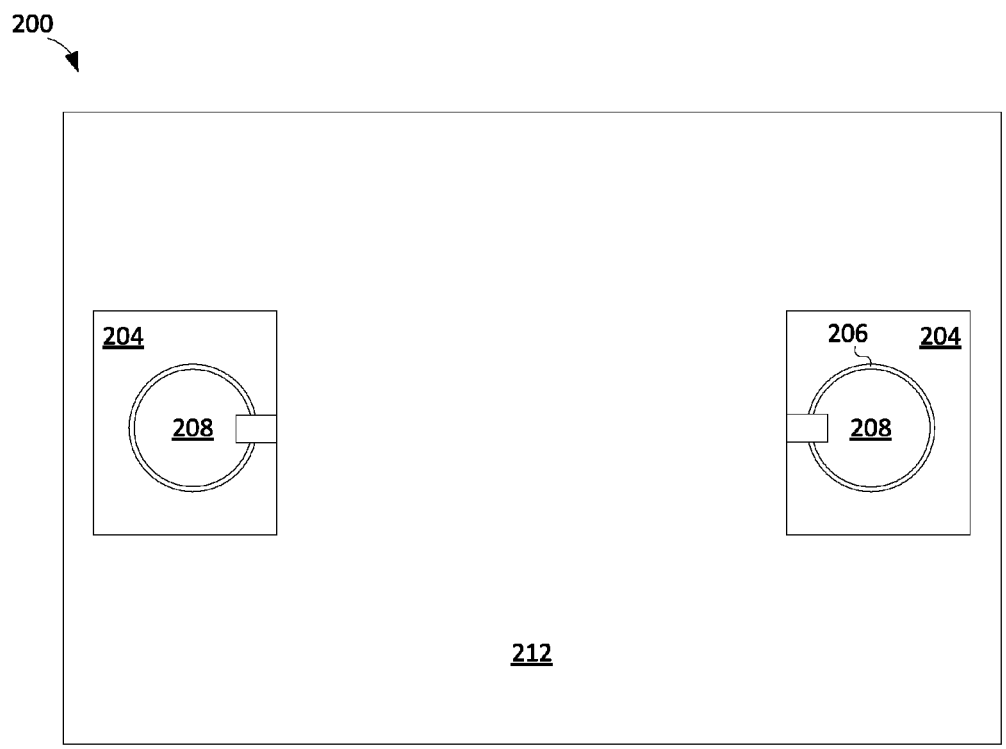
Figure 5F:
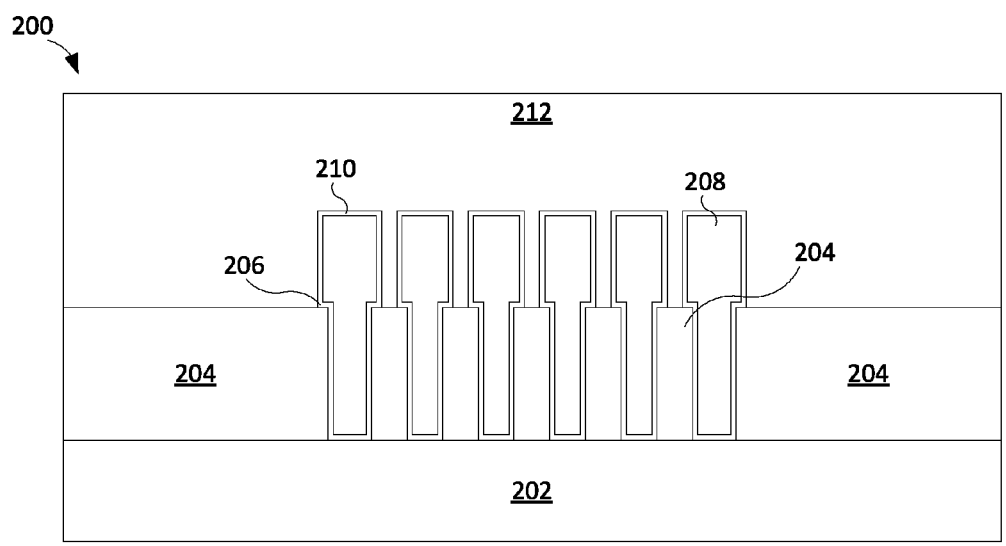
Figure 6F:
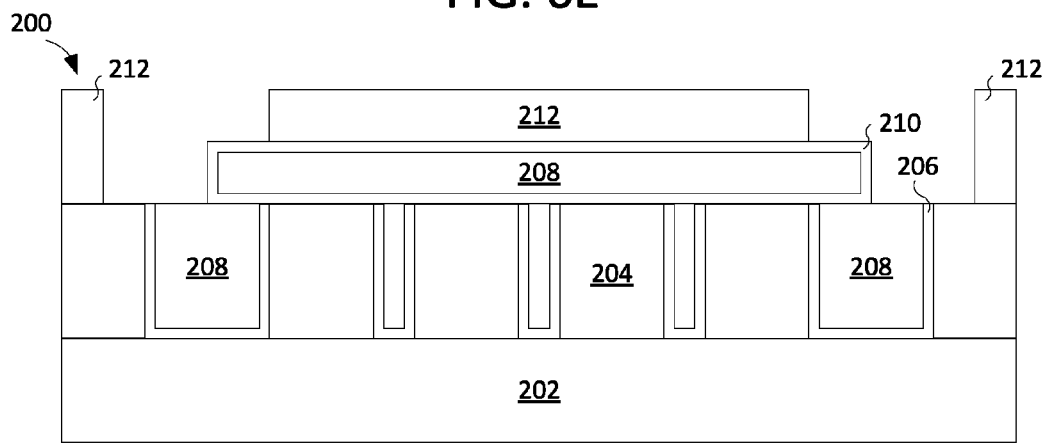

As illustrated in FIGS. 4F, 5F, and 6F, the ILD layer 212 is patterned. In one example, patterning involves removing portions of the ILD layer 212 to create large feature areas. Thus, a portion of the ILD layer 212 is removed down to the first dielectric layer 204 to create recesses or trenches for large features such as electrical pads. In one example, the large feature areas may overlap slightly with the high-density line-space areas (e.g., as evidenced by the fact that some of the conductive lines of the first conductive metal layer 208 extend into the large feature areas).

Figure 4G:
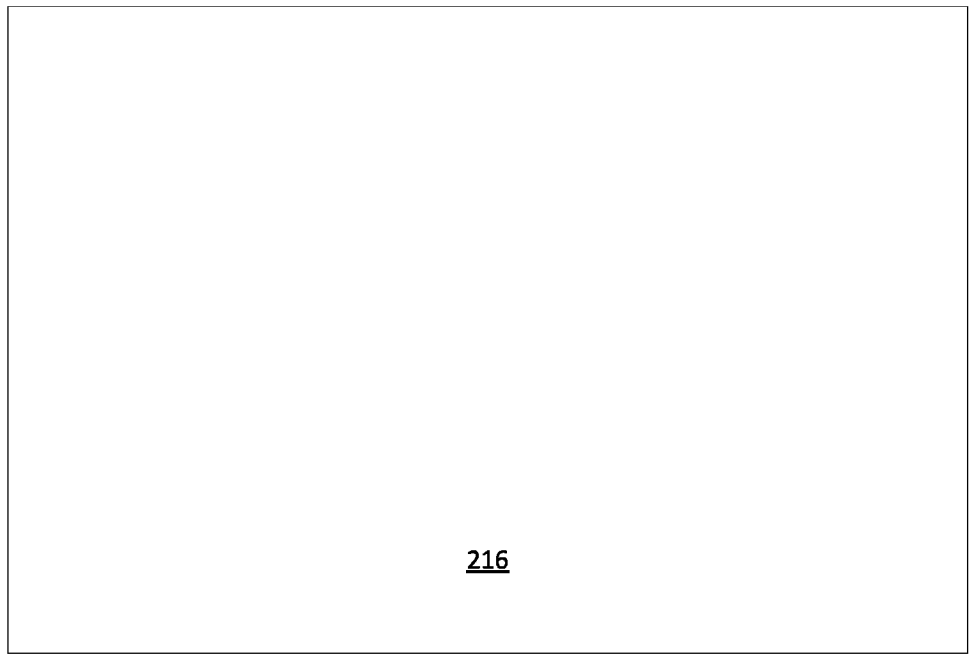
Figure 5G:
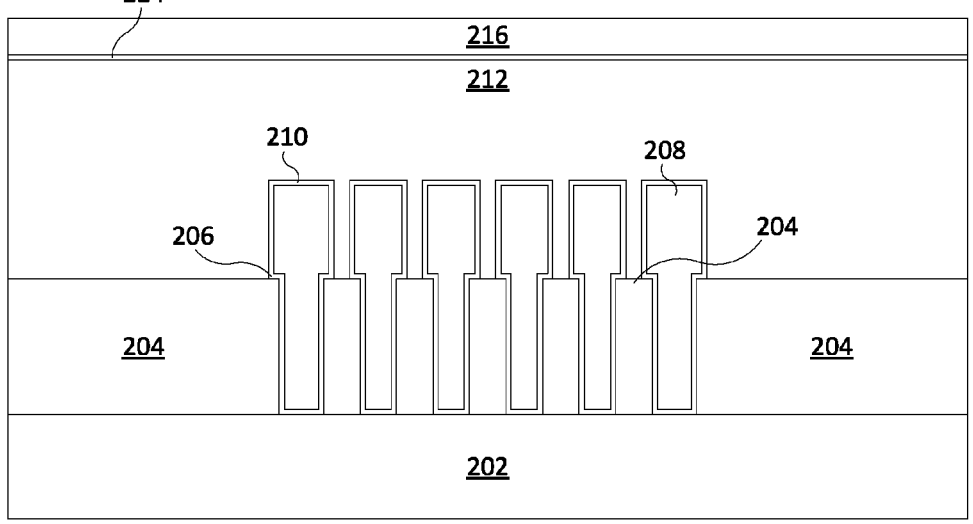
Figure 6G:
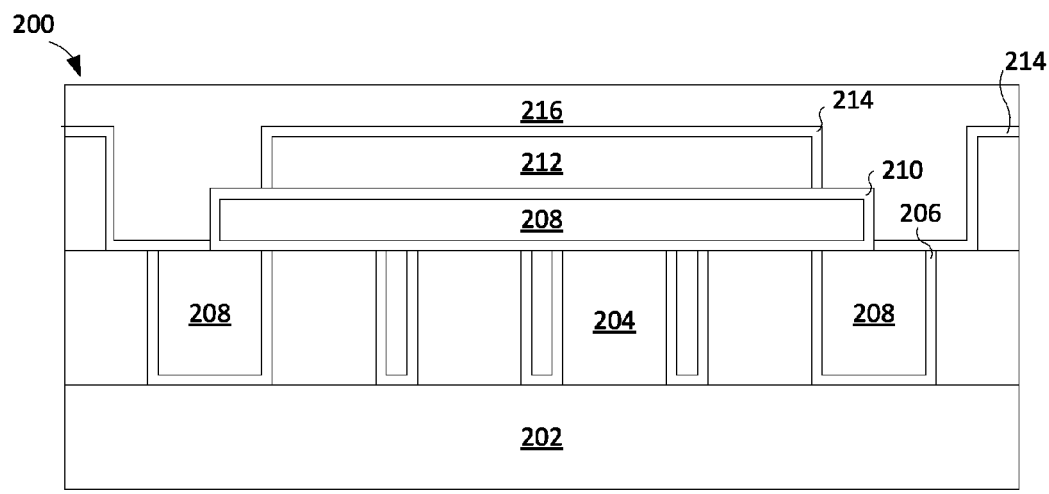

As illustrated in FIGS. 4G, 5G, and 6G, a third liner layer 214 is next deposited over the first dielectric layer 204 and ILD layer 212. A second conductive metal layer 216 is then deposited over the third liner layer 214, for example via an electroplating process or a vapor deposition process. As illustrated, the second conductive metal layer 216 fills in the large feature areas created in FIGS. 3F and 4F. In one example, the third liner layer 214 is formed from the same material as the first liner layer 206 and the second liner layer 210. In a further example, the second conductive metal layer 216 is formed from the same conductive material (e.g., copper, or other conductive metal or metal alloy) and the first conductive metal layer 208.

Figure 4H:
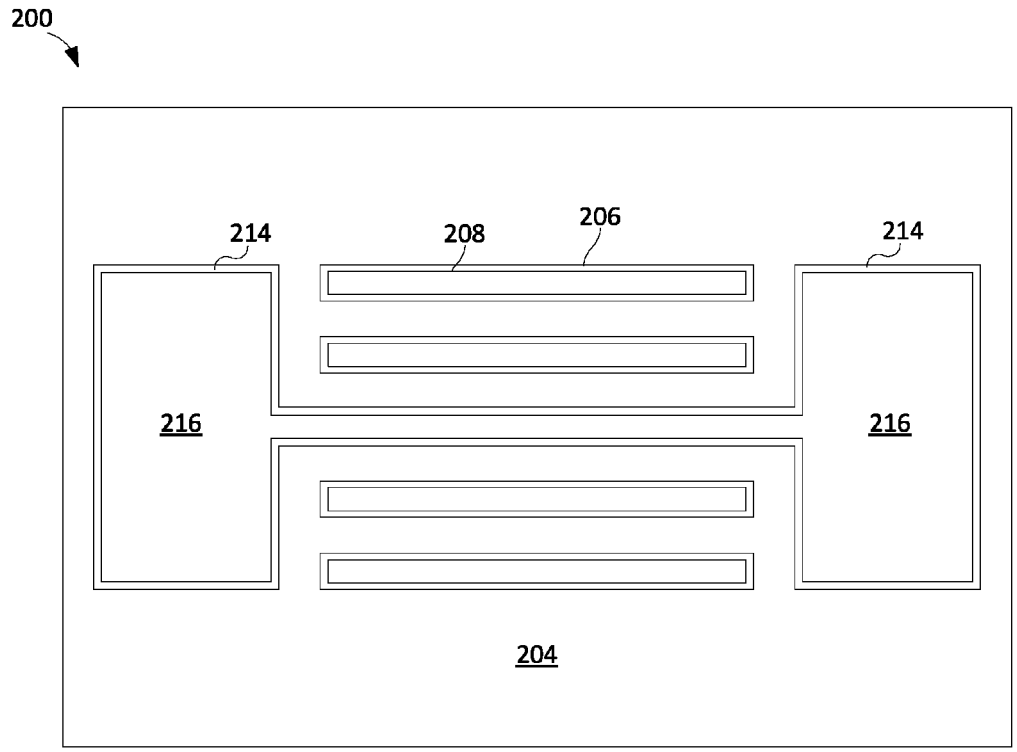
Figure 5H:
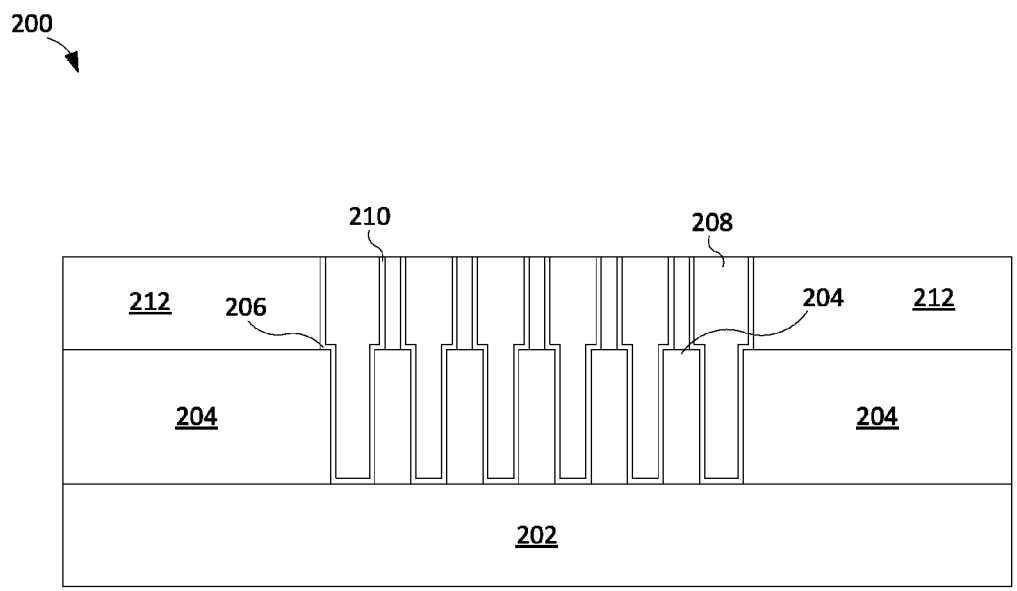
Figure 6H:
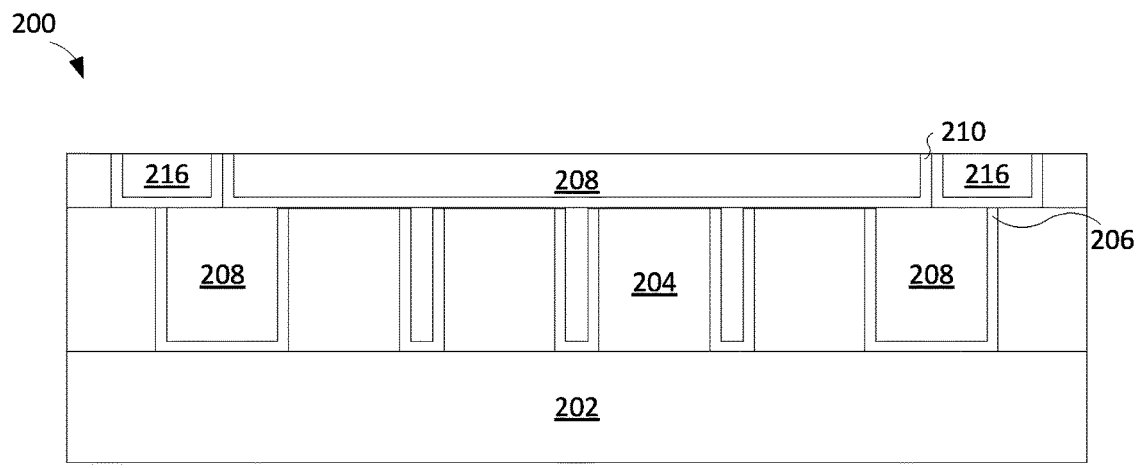

As illustrated in FIG. 4H, FIGS. 5H, and 6H the second conductive metal layer 216 is next polished down to the ILD layer 212. Thus, this polishing step removes some of the second conductive metal layer 216 and the third liner layer 214.

The resultant three-dimensional IC 200 includes two levels; a first level including a high-density line-space area comprised of the conductive lines and large feature areas (e.g., electrical pads) and a second level including through-silicon vias for connecting the IC to other wafers. The vias and the high-density line-space area are formed via the subtractive etch processes illustrated in FIGS. 4C, 5C, and 6C. The large feature areas are formed via the metal fill process illustrated in FIGS. 4G, 5G, and 6G. Thus, the large feature areas are largely unaffected by the subtractive etch process that is used to form the interconnects and vias. An advantage of the process illustrated in FIGS. 4A-4H, 5A-5H, and 6A-6H is that the interface between the vias and the high-density conductive lines is plated in one step (i.e., as illustrated in FIGS. 4C, 5C, and 6C), as a continuous line. In cases where the resistance between a large via and a large electrical pad is high, the contacts can be sized to mitigate the high resistance.

The process illustrated in FIGS. 4A-4H, 5A-5H, and 6A-6H can be adapted to fabricate ICs having additional levels. FIGS. 7A-7D, FIGS. 8A-8D, and FIGS. 9A-9D for instance, illustrate a multi-level integrated circuit (IC) 300 during various stages of a third fabrication process performed according to examples of the present disclosure. As such, when viewed in sequence, FIGS. 7A-7D, FIGS. 8A-8D, and FIG. 9A-9D also serve as a flow diagram for a portion of the third fabrication process. In particular, FIGS. 7A-7D illustrate top views of the IC 300 during various stages of the third fabrication process, while FIGS. 8A-8D illustrate first corresponding cross sectional views (i.e., taken along sectional line A-A' of FIG. 7A) of the IC 300 of FIGS. 7A-7D during the various stages of the third fabrication process, and FIGS. 9A-9D illustrate second corresponding cross sectional views (i.e., taken along sectional line B-B' of FIG. 7A) of the IC 300 of FIGS. 7A-7D during the various stages of the third fabrication process.

Figure 7A:
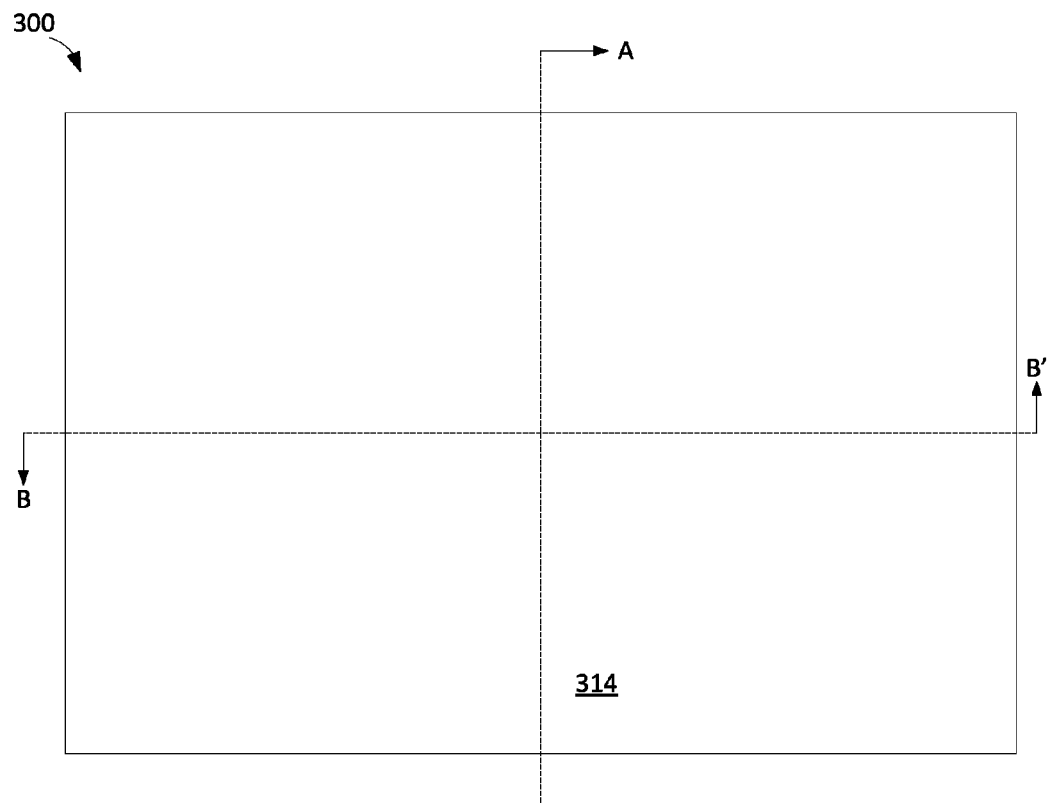
FIGS. 7A-7D illustrate top views of an integrated circuit during various stages of a third fabrication process.
Figure 8A:
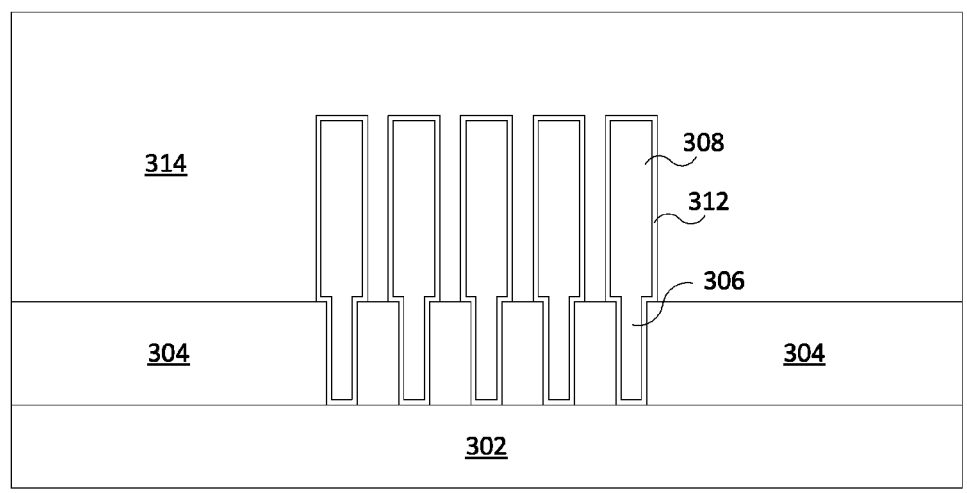
FIGS. 8A-8D illustrate corresponding cross sectional views of the integrated circuit of FIGS. 7A-7D taken along line A-A' of FIG. 7A during the various stages of the third fabrication process.
Figure 9A:
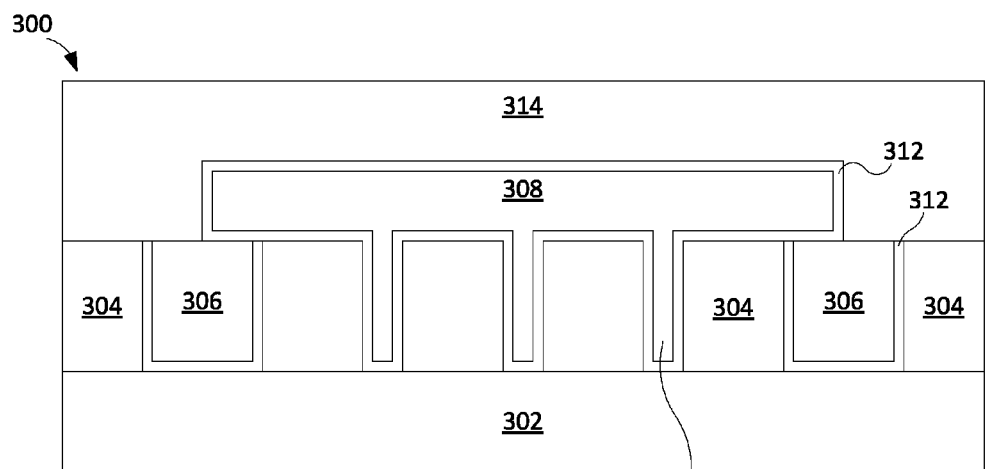
FIGS. 9A-9D illustrate corresponding cross sectional views of the integrated circuit of FIGS. 7A-7D taken along line B-B' of FIG. 7A during the various stages of the third fabrication process.

Referring simultaneously to FIG. 7A, FIG. 8A, and FIG. 9A the IC 300 undergoes a series of fabrication steps similar to those illustrated in FIGS. 4A-4H, FIGS. 5A-5H, and FIG. 6A-6H. Thus, FIGS. 7A, 8A, and 9A illustrate the IC 300 at an intermediate step in the fabrication process. At this intermediate step, the IC 300 includes a wafer 302, a dielectric layer 304 deposited on the wafer 302, and a first plurality of vias 306 formed in the dielectric layer 304. The first plurality of vias 306 is coupled to a plurality of conductive lines 308, which is in turn coupled to a second plurality of vias 310. In one example, the first plurality of vias 306, the plurality of conductive lines 308, and the second plurality of vias 310 are formed from a conductive metal, such as copper. However, the first plurality of vias 106, the plurality of conductive lines 308, and the second plurality of vias 310 could comprise any metal or metal alloy (including, but not limited to, gold or silver). The first plurality of vias 306, the plurality of conductive lines 308, and the second plurality of vias 310 are all lined by liners 312 (which may comprise, for example, tantalum (Ta), tantalum nitride (TaN), cobalt (Co), manganese (Mn), manganese oxides (MnOx), or manganese silicates (MnSixOy)). In the step illustrated in FIGS. 5A and 6A, an interlayer dielectric (ILD) layer 314 is deposited over the dielectric layer 304 and over the plurality of conductive lines 308 and the second plurality of vias 310. The ILD layer 314 may be polished or planarized after deposition.

Figure 7B:
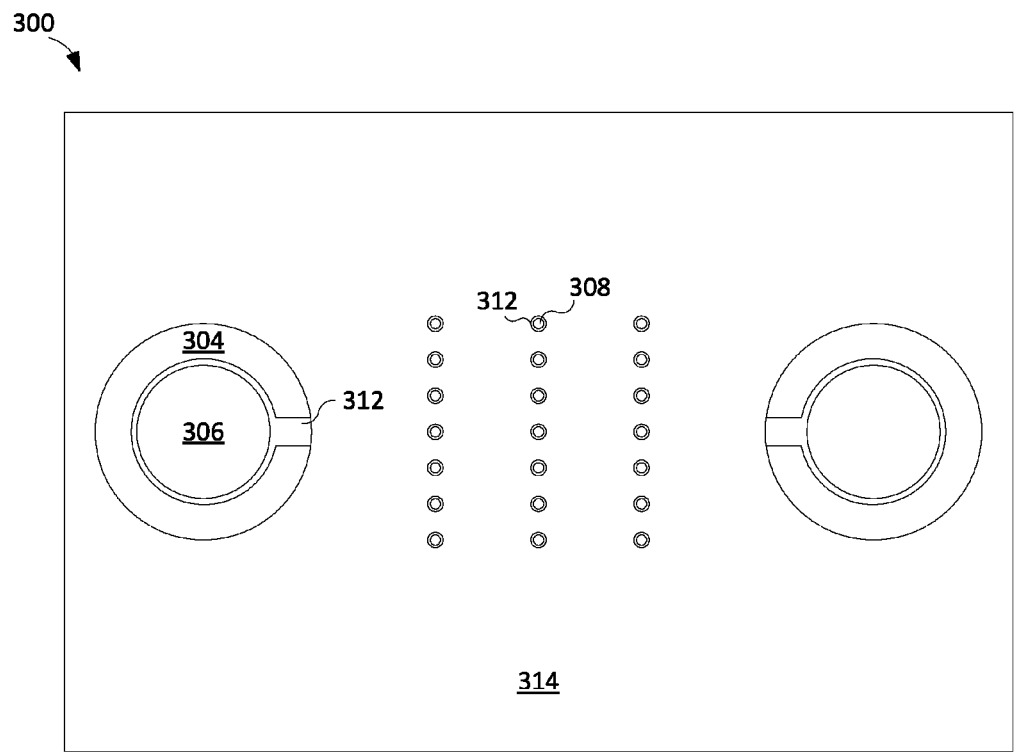
Figure 8B:
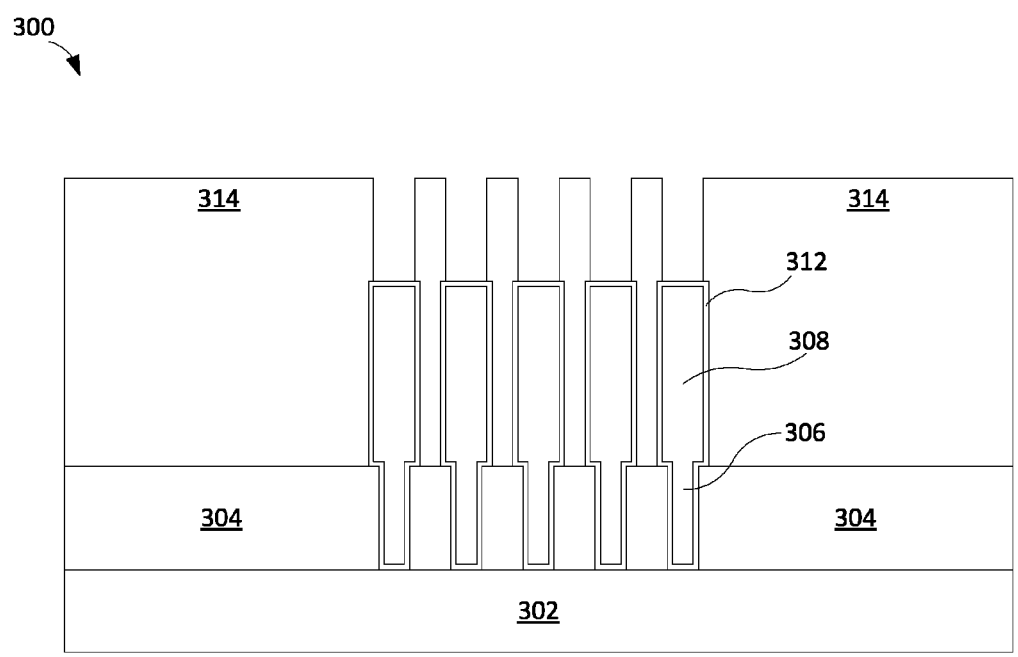
Figure 9B:
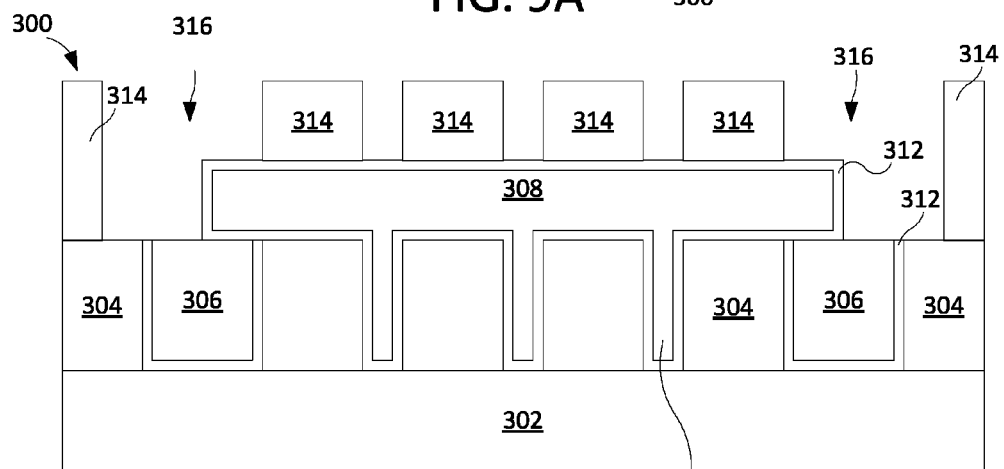

As illustrated in FIGS. 7B, 8B, and 9B, the ILD layer 314 is etched down to the dielectric layer 304 in the areas surrounding some of the first plurality of vias 306 (i.e., the larger vias of the first plurality of vias 306). In addition, the metal in the second plurality of vias 310 is removed.

Figure 7C:
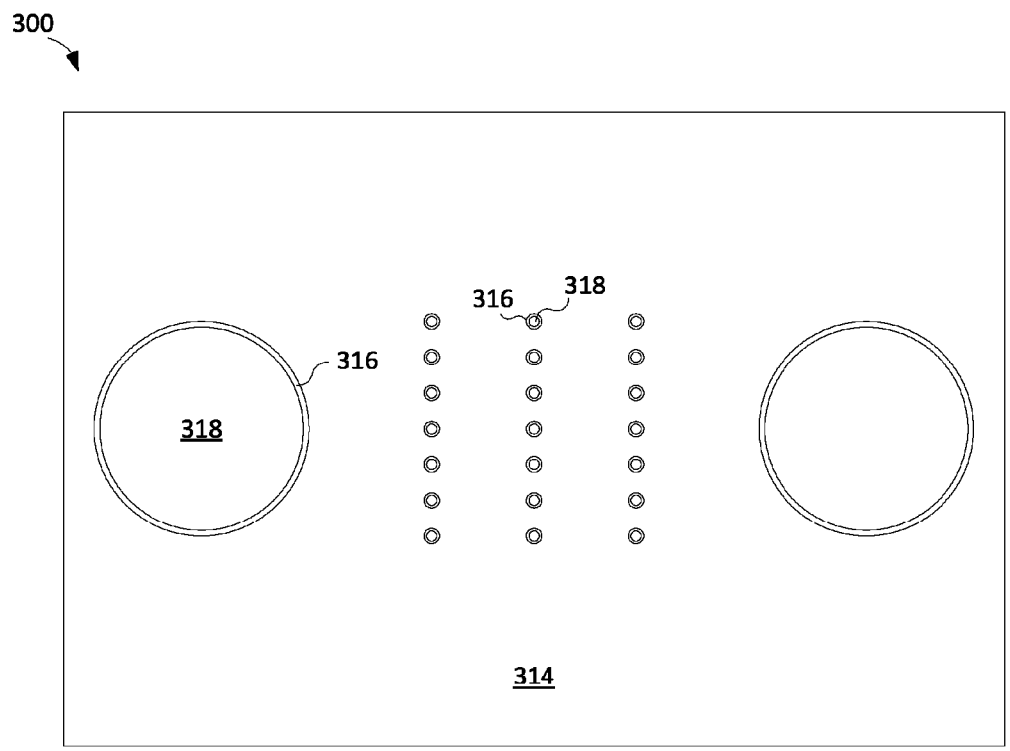
Figure 8C:
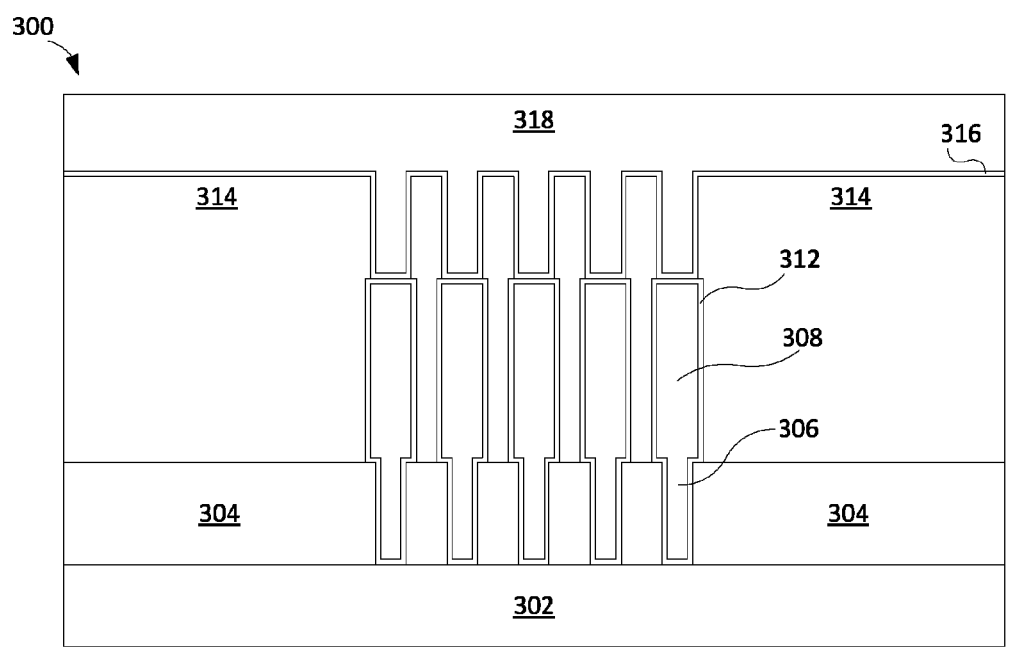
Figure 9C:
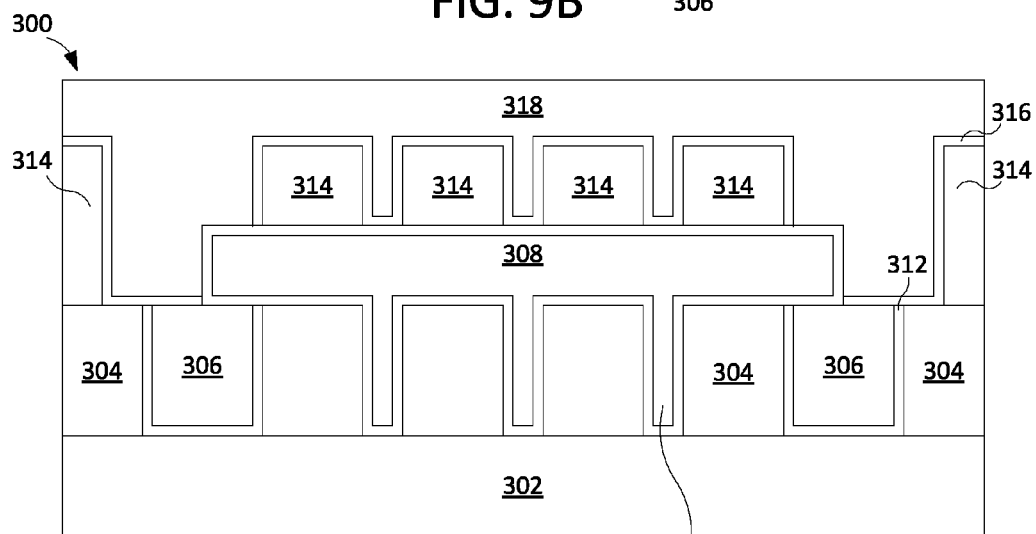

As illustrated in FIGS. 7C, 8C, and 9C, a liner layer 316 is next deposited over the ILD layer 314. The liner layer 316 lines the areas in which the ILD layer 314 and the metal was removed in FIGS. 5B and 6B (i.e., the larger vias of the first plurality of vias 306 and the second plurality of vias 310). Next, a metal fill process such as electroplating or vapor deposition is used to deposit a metal layer 318 over the liner layer 316. The metal layer 318 comprises a conductive metal such as copper. However, the metal layer 318 could comprise any metal or metal alloy (including, but not limited to, gold or silver).

Figure 7D:
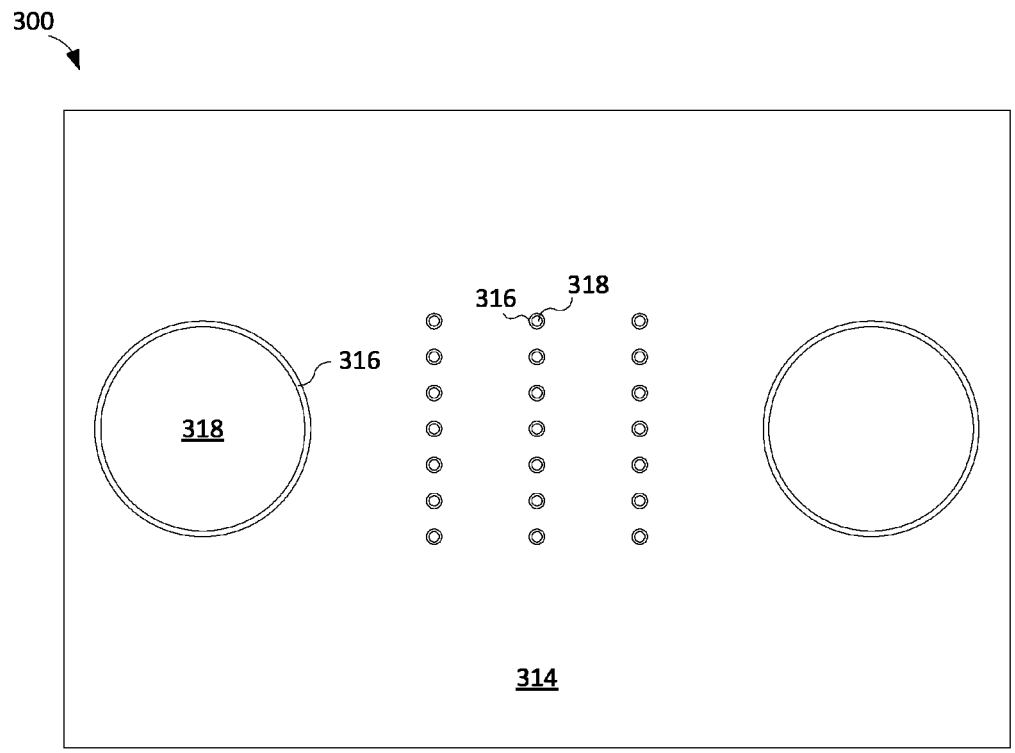
Figure 8D:
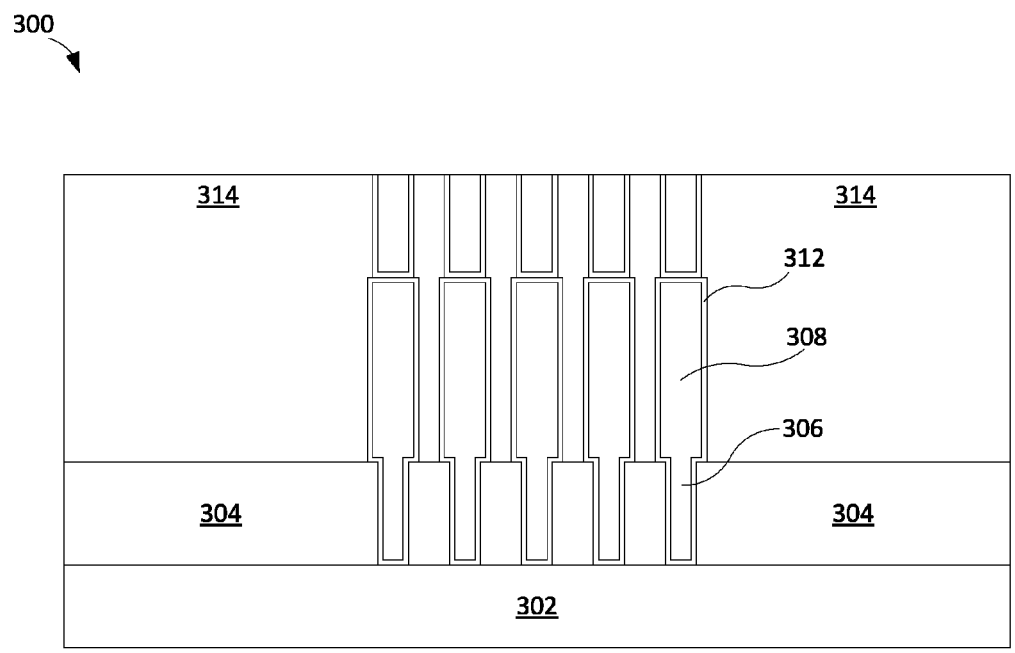
Figure 9D:
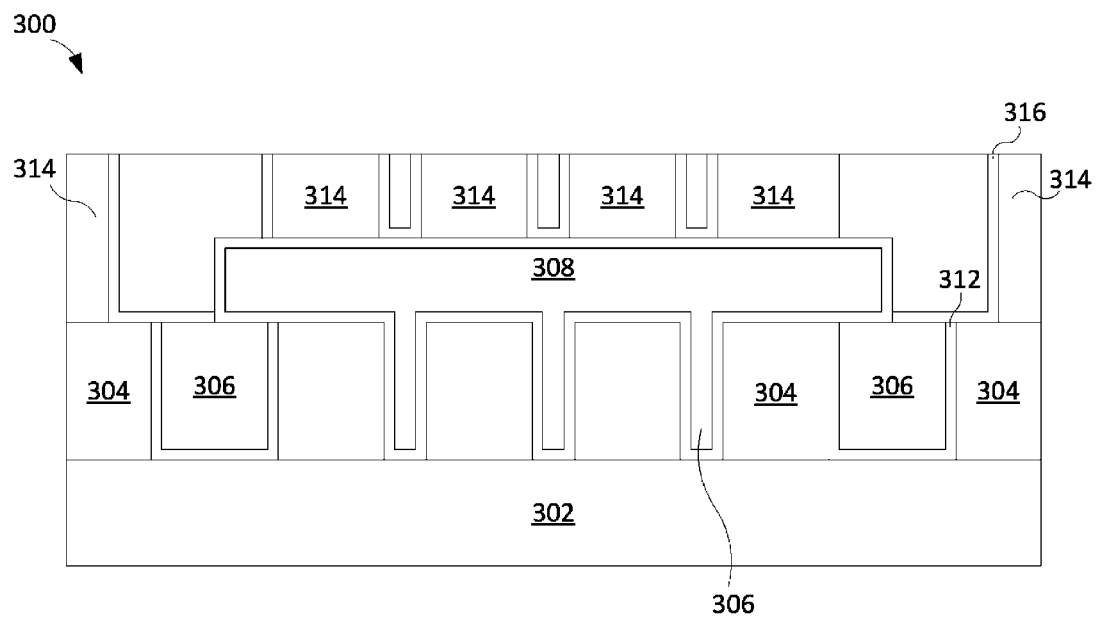

As illustrated in FIGS. 7D, 8D, and 9D, the metal layer 318 and the liner layer 316 are polished or planarized (e.g., using chemical mechanical planarization) down to the ILD layer 314.

Figure 10A:
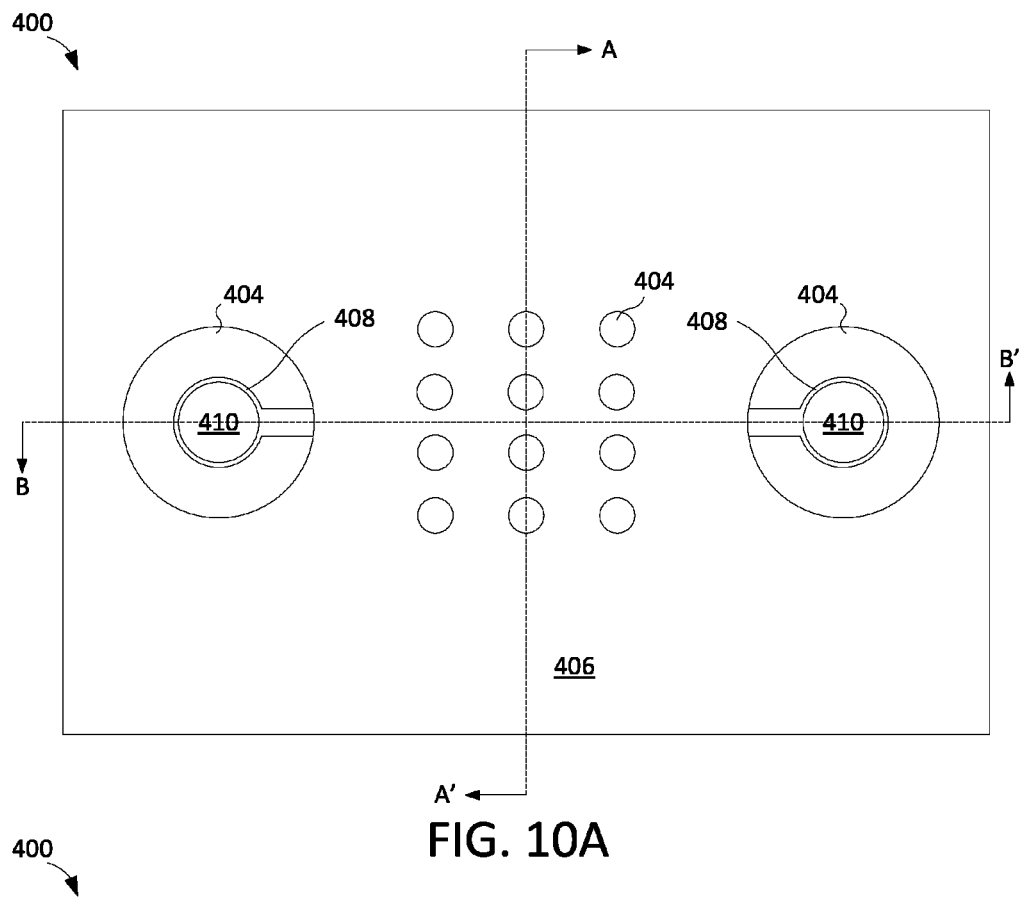
FIGS. 10A-10C illustrate top views of an integrated circuit during various stages of the fourth fabrication process.
Figure 11A:
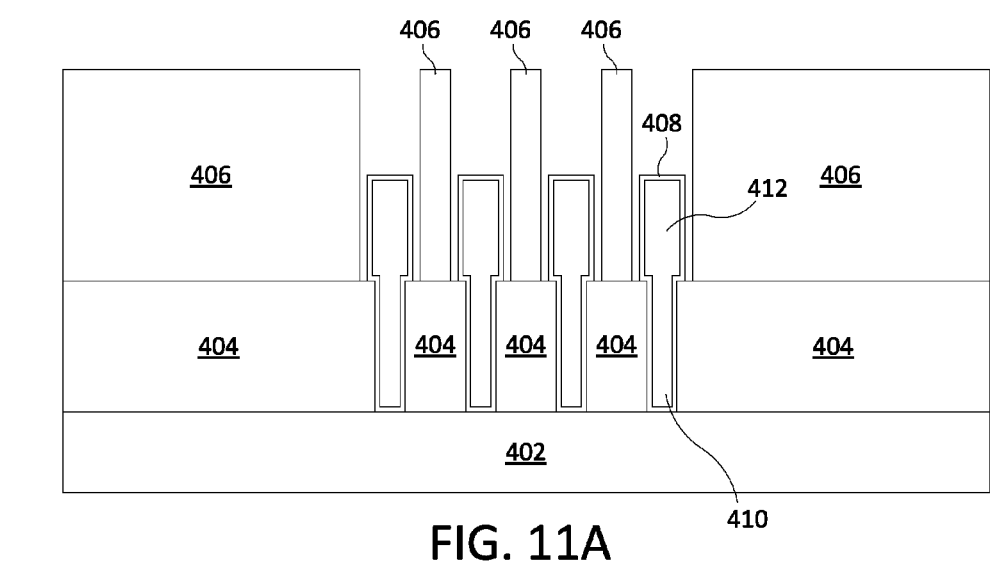
FIGS. 11A-11C illustrate corresponding cross sectional views of the integrated circuit of FIGS. 10A-10C taken along line A-A' of FIG. 10A during the various stages of the fourth fabrication process.
Figure 10B:
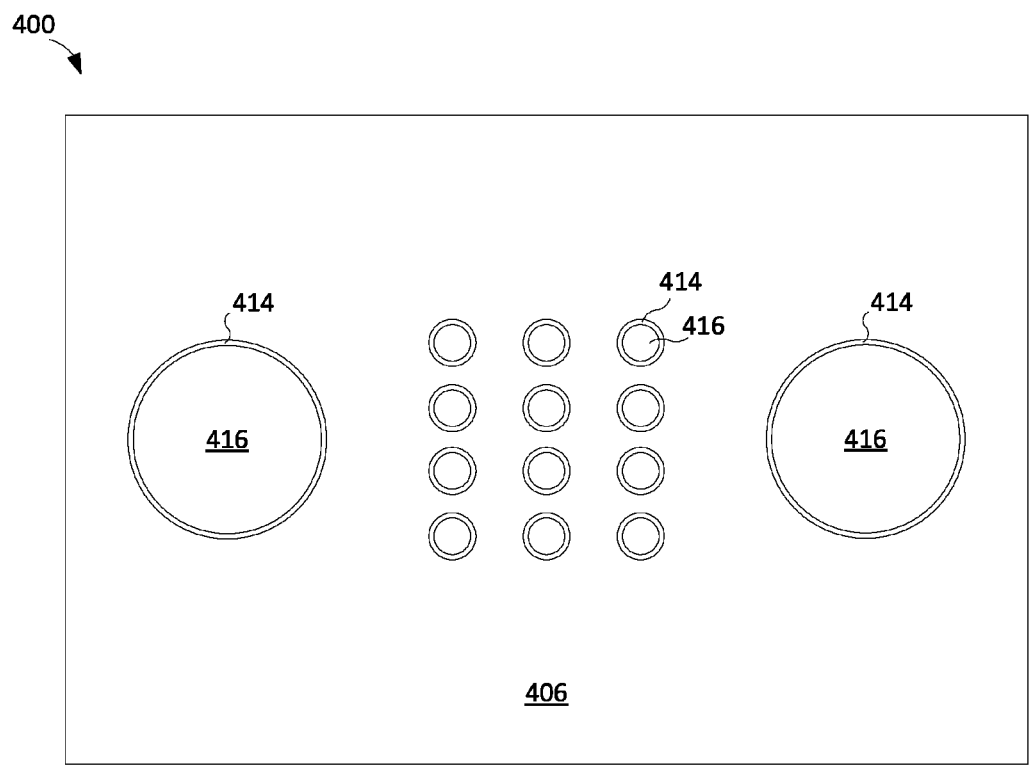
Figure 11B:
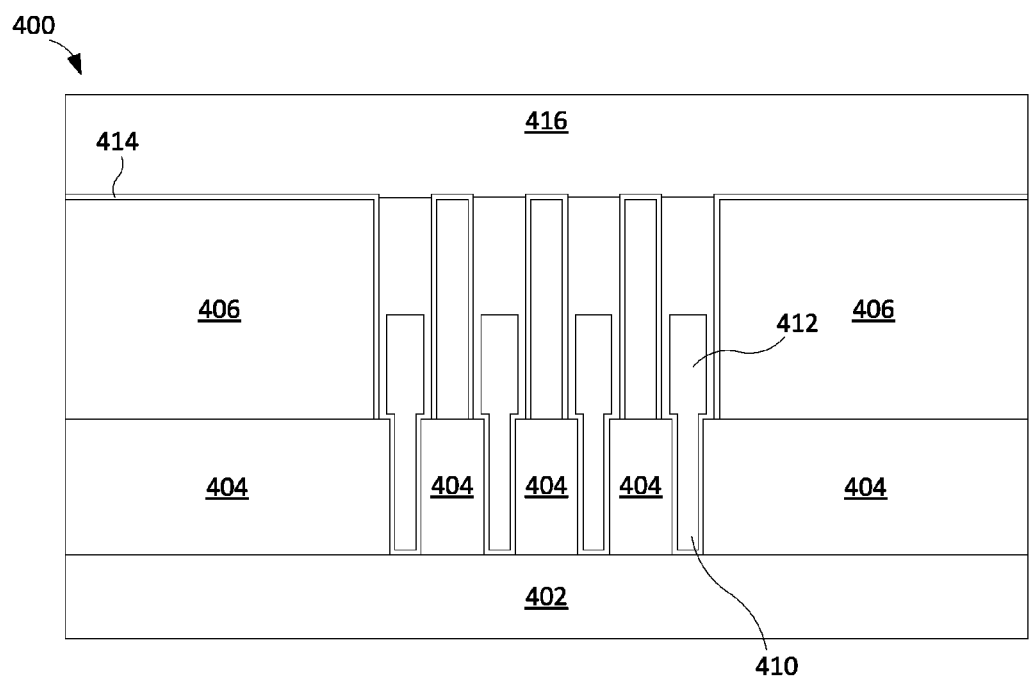
Figure 10C:
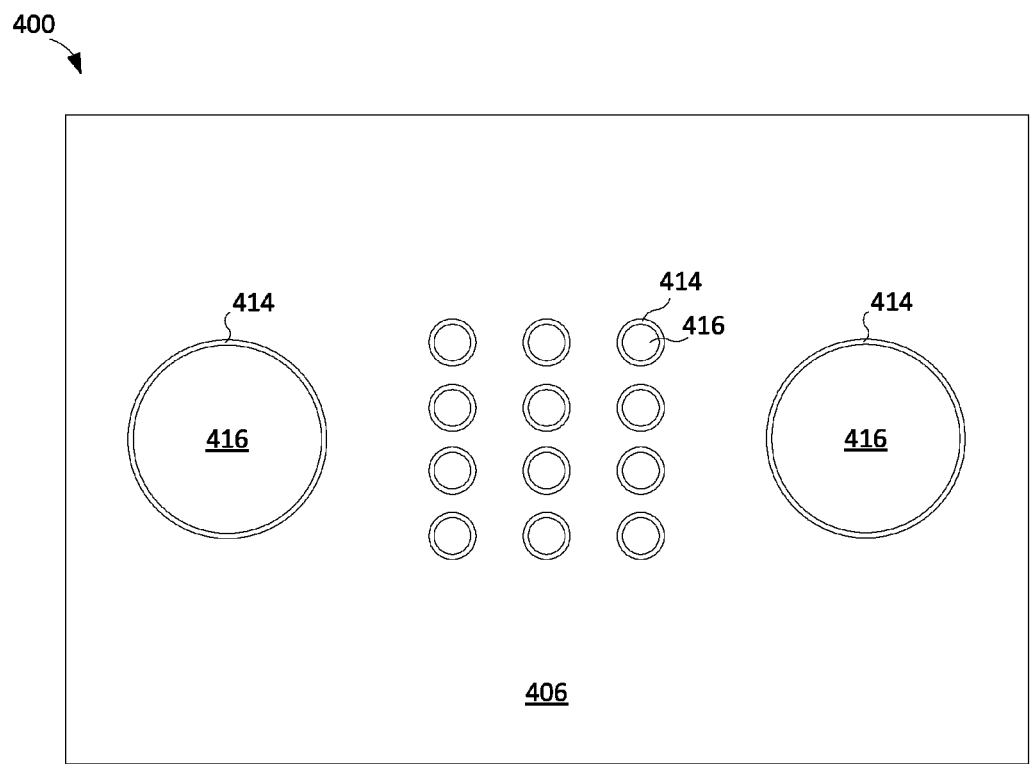
Figure 11C:
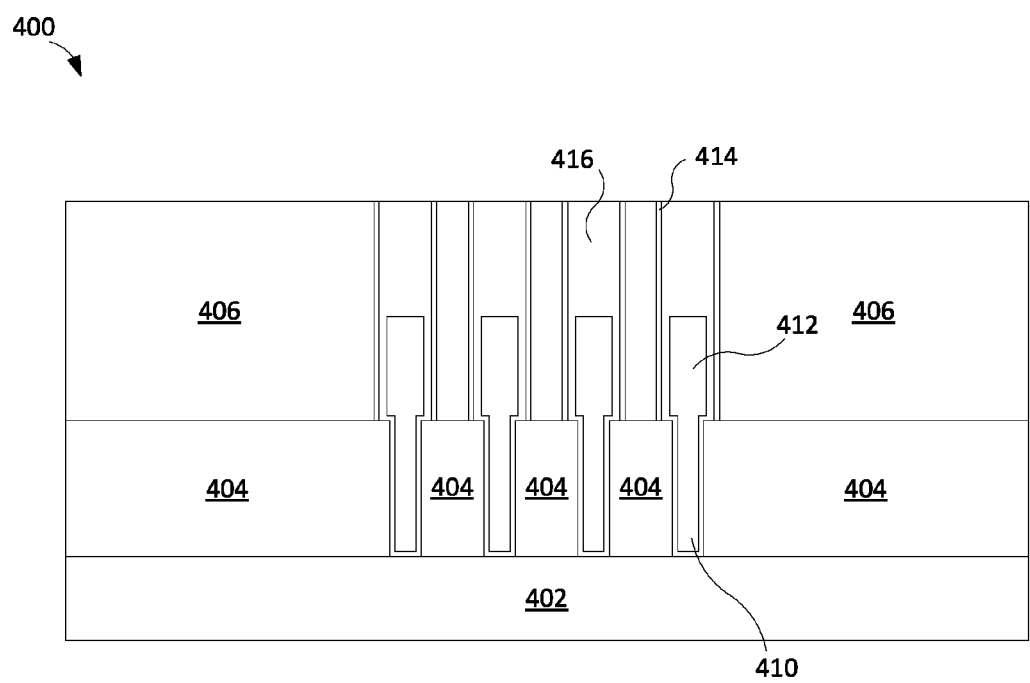
Figure 12A:
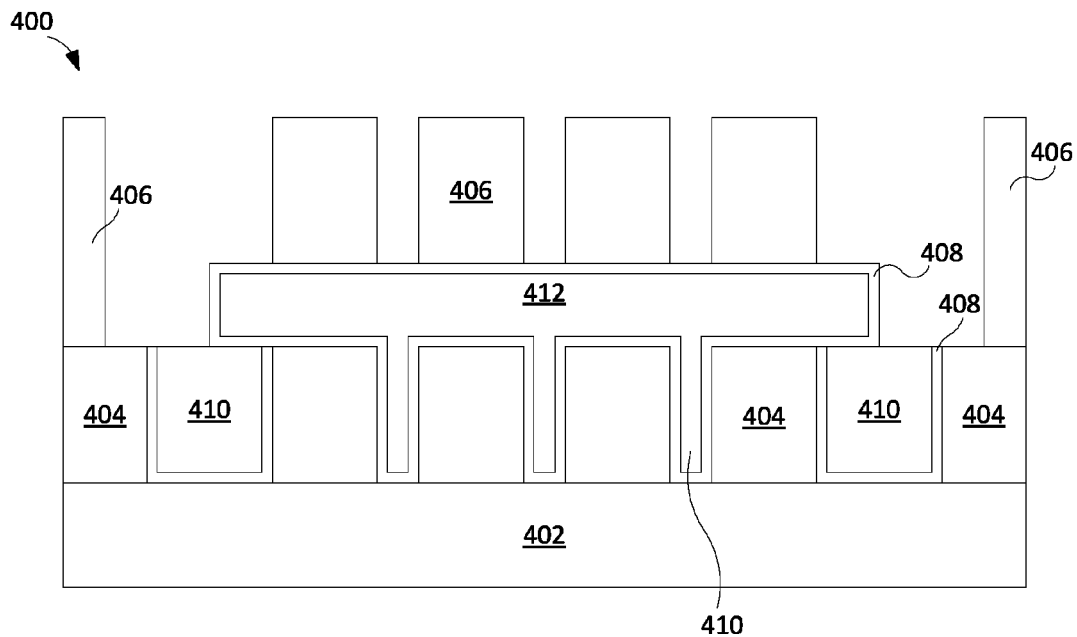
FIGS. 12A-12C illustrate corresponding cross sectional views of the integrated circuit of FIGS. 10A-10C taken along line B-B' of FIG. 10A during the various stages of the fourth fabrication process.
Figure 12B:
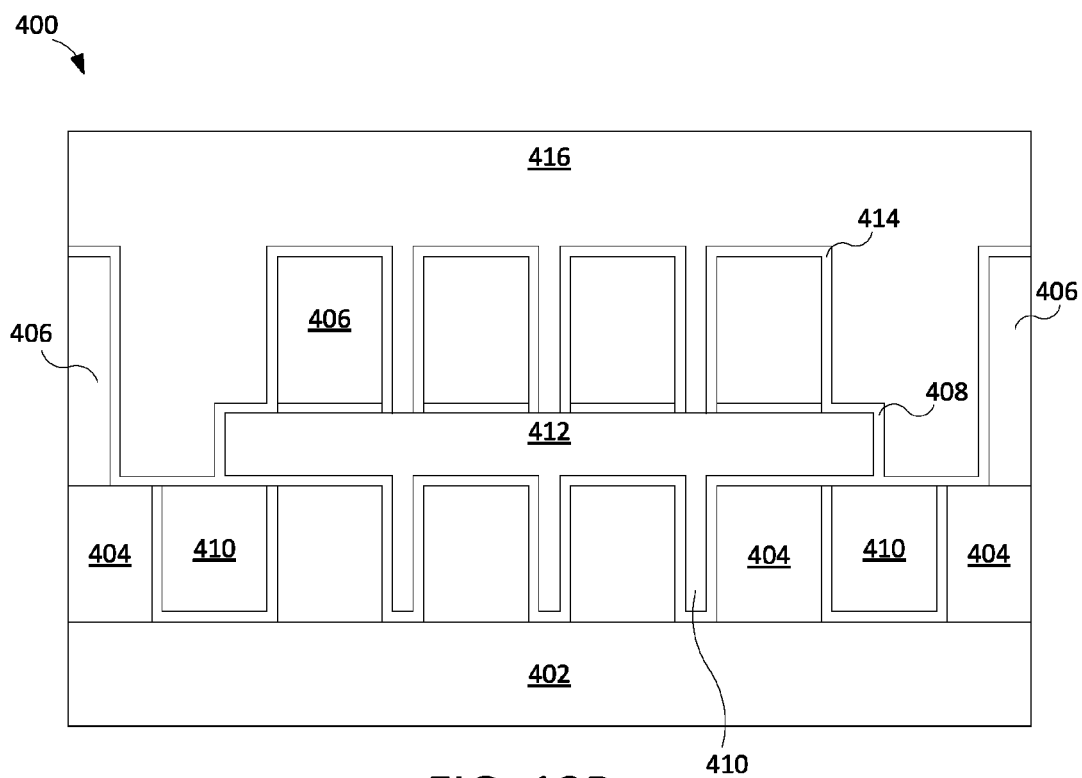
Figure 12C:
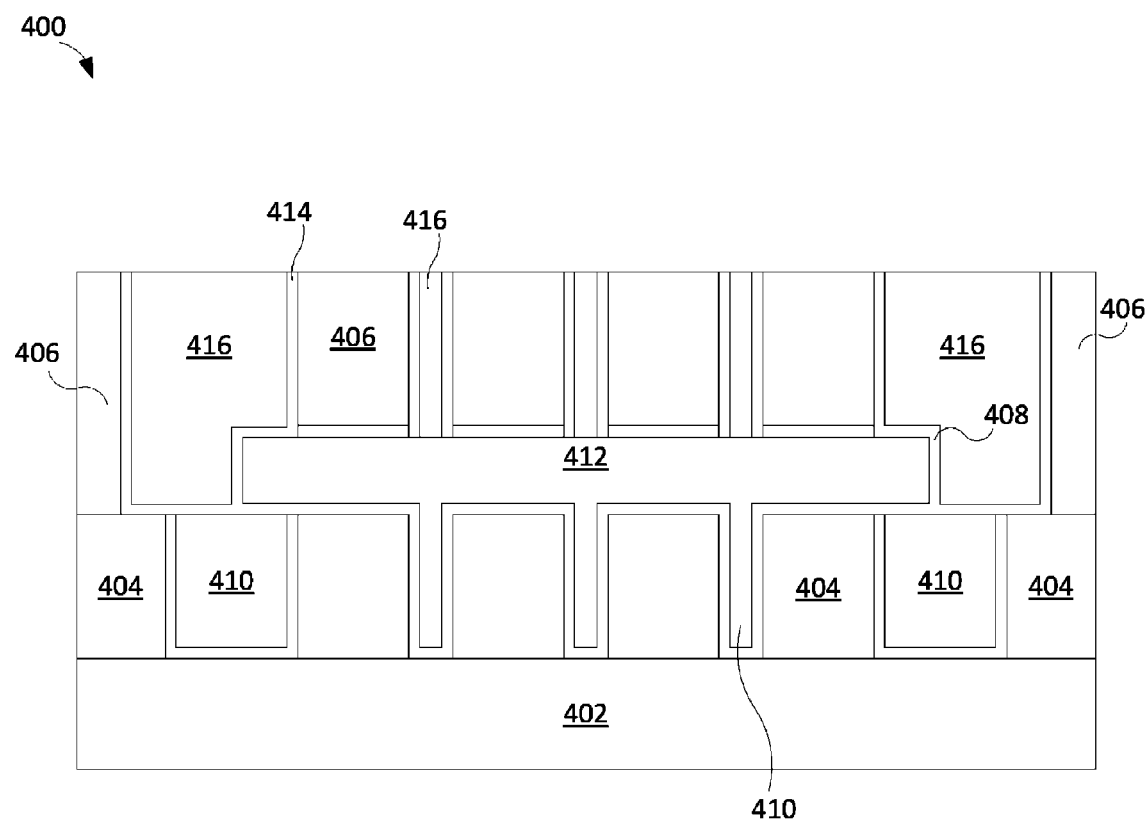

FIGS. 10A-10C, FIGS. 11A-11C, and FIGS. 12A-12C illustrate a multi-level integrated circuit (IC) 400 during various stages of a fourth fabrication process performed according to examples of the present disclosure. As such, when viewed in sequence, FIGS. 10A-10C, FIGS. 11A-11C, and FIGS. 12A-12C also serve as a flow diagram for a portion of the fourth fabrication process. In particular, FIGS. 10A-10C illustrate top views of the IC 400 during various stages of the fourth fabrication process, while FIGS. 11A-11C illustrate first corresponding cross sectional views (i.e., taken along sectional line A-A' of FIG. 10A) of the IC 400 of FIGS. 10A-10C during the various stages of the fourth fabrication process, and FIGS. 12A-12C illustrate second corresponding cross sectional views (i.e., taken along sectional line B-B' of FIG. 10A) of the IC 400 of FIGS. 10A-10C during the various stages of the fourth fabrication process.

Referring simultaneously to FIG. 10A, FIG. 11A, and FIG. 12A, the IC 400 undergoes a series of fabrication steps similar to those illustrated in FIGS. 4A-4H, FIGS. 5A-5H, and FIGS. 6A-6H. Thus, FIGS. 10A, 11A, and 12A illustrate the IC 400 at an intermediate step in the fabrication process. At this intermediate step, the IC 400 includes a wafer 402, a dielectric layer 404 deposited on the wafer 402, and a first plurality of vias 410 formed in the dielectric layer 404. The first plurality of vias 410 is coupled to a plurality of conductive lines 412. In one example, the first plurality of vias 410 and the plurality of conductive lines 412 are formed from a conductive metal, such as copper. However, the first plurality of vias 410 and the plurality of conductive lines 412 could comprise any metal or metal alloy (including, but not limited to, gold or silver). The first plurality of vias 410 and the plurality of conductive lines 412 are all lined by liners 408 (which may comprise, for example, tantalum (Ta), tantalum nitride (TaN), cobalt (Co), manganese (Mn), manganese oxides (MnOx), or manganese silicates (MnSixOy)). An interlayer dielectric (ILD) layer 406 is deposited over the dielectric layer 404 and the plurality of conductive lines 412.

In the step illustrated in FIGS. 10A, 11A, and 12A, the ILD layer 406 is etched down to the dielectric layer 404 in the areas surrounding some of the first plurality of vias 410 (i.e., the areas above the larger vias of the first plurality of vias 410) and in the areas surrounding the plurality of conductive lines 412. Thus, the IC 400 of FIGS. 10A, 11A, and 12A closely resembles the IC 300 of FIGS. 7B, 8B, and 9B; however, an additional amount of the ILD layer 406 (i.e., the portions surrounding the plurality of conductive lines 412) is removed in FIGS. 10A, 11A, and 12A to create trenches around the plurality of conductive lines.

As illustrated in FIGS. 10B, 11B, and 12B, a liner layer 414 is next deposited over the ILD layer 406. The liner layer 414 lines the areas in which the ILD layer 406 was removed in FIGS. 10A, 11A, and 12A (i.e., the areas above the larger vias of the first plurality of vias 410 and the areas surrounding the plurality of conductive lines 412). Next, a metal fill process such as electroplating or vapor deposition is used to deposit a metal layer 416 over the liner layer 414. In one embodiment, different metals may be used to fill the trenches surrounding the plurality of conductive lines 412 and the areas above the larger vias of the first plurality of vias 410). In one example, at least one of the metals comprises a conductive metal such as copper. However, the metals could comprise any metal or metal alloy (including, but not limited to, gold or silver).

As illustrated in FIGS. 10C, 11C, and 12C, the metal layer 416 and liner layer 414 are polished or planarized (e.g., using chemical mechanical planarization) down to the ILD layer 406.

Although various embodiments which incorporate the teachings of the present invention have been shown and described in detail herein, those skilled in the art can readily devise many other varied embodiments that still incorporate these teachings.

What is claimed is:

1. An integrated circuit comprising:
a wafer;
a layer of dielectric material deposited on the wafer;
a plurality of conductive lines formed on the layer of dielectric material;
a first plurality of vias coupled to the plurality of conductive lines and extending through the layer of dielectric material, wherein interfaces between the plurality of conductive lines and at least some of the first plurality of vias are formed as continuous lines of metal;
a large feature area formed from a conductive metal or a conductive metal alloy and positioned outside of the plurality of conductive lines, wherein the large feature area includes an electrical pad, and wherein a contact of the electrical pad is sized to minimize a resistance between the electrical pad and a via of the first plurality of vias.

2. The integrated circuit of claim 1, wherein the large feature overlaps with at least one of the plurality of conductive lines.

3. The integrated circuit of claim 1, wherein at least one via of the first plurality of vias is positioned below the large feature area.

4. The integrated circuit of claim 1, wherein the large feature area is formed from the same material as the plurality of conductive lines and the first plurality of vias.

5. The integrated circuit of claim 1, further comprising:
a liner positioned between the layer of dielectric material and each via of the first plurality of vias.

6. The integrated circuit of claim 1, further comprising:
a liner positioned between the layer of dielectric material and each line of the plurality of conductive lines.

7. The integrated circuit of claim 1, further comprising:
an interlayer dielectric layer deposited over the layer of dielectric material; and
a second plurality of vias coupled to the plurality of conductive lines and extending through the interlayer dielectric layer.

8. The integrated circuit of claim 7, wherein the second plurality of vias is formed from the same material as the first plurality of vias and the plurality of conductive lines.

9. The integrated circuit of claim 1, wherein the plurality of conductive lines have dimensions smaller than forty nanometers.

10. The integrated circuit of claim 1, wherein a liner is positioned between the at least one via of the first plurality of vias and the large feature area.

11. An integrated circuit comprising:
a wafer;
a layer of dielectric material deposited on the wafer;
a plurality of conductive lines formed on the layer of dielectric material;
a first plurality of vias coupled to the plurality of conductive lines and extending through the layer of dielectric material, wherein interfaces between the plurality of conductive lines and at least some of the first plurality of vias are formed as continuous lines of metal;
a large feature area formed from a conductive metal or a conductive metal alloy and positioned outside of the plurality of conductive lines; and
a liner positioned between the at least one via of the first plurality of vias and the large feature area.

12. The integrated circuit of claim 11, wherein the large feature area includes an electrical pad.

13. The integrated circuit of claim 11, wherein a contact of the electrical pad is sized to minimize a resistance between the electrical pad and a via of the first plurality of vias.

14. The integrated circuit of claim 11, wherein the large feature overlaps with at least one of the plurality of conductive lines.

15. The integrated circuit of claim 11, wherein at least one via of the first plurality of vias is positioned below the large feature area.

16. The integrated circuit of claim 11, wherein the large feature area is formed from the same material as the plurality of conductive lines and the first plurality of vias.

17. The integrated circuit of claim 11, further comprising:
a liner positioned between the layer of dielectric material and each via of the first plurality of vias.

18. The integrated circuit of claim 11, further comprising:
a liner positioned between the layer of dielectric material and each line of the plurality of conductive lines.

19. The integrated circuit of claim 11, further comprising:
an interlayer dielectric layer deposited over the layer of dielectric material; and
a second plurality of vias coupled to the plurality of conductive lines and extending through the interlayer dielectric layer.

20. The integrated circuit of claim 19, wherein the second plurality of vias is formed from the same material as the first plurality of vias and the plurality of conductive lines.

* * * * *